(12) United States Patent
Kayano

(10) Patent No.: US 7,983,637 B2
(45) Date of Patent: Jul. 19, 2011

(54) AMPLIFIER, RADIO TRANSMITTING APPARATUS, AND RADIO RECEIVING APPARATUS

(75) Inventor: Hiroyuki Kayano, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 433 days.

(21) Appl. No.: 12/235,951

(22) Filed: Sep. 23, 2008

(65) Prior Publication Data

US 2009/0088095 A1    Apr. 2, 2009

(30) Foreign Application Priority Data

Sep. 25, 2007 (JP) ................. 2007-246551

(51) Int. Cl.
*H04B 1/04* (2006.01)
*H01P 1/02* (2006.01)
(52) U.S. Cl. .............. 455/127.2; 455/127.3; 455/198.1; 455/216; 333/202
(58) Field of Classification Search .............. 455/127.2, 455/127.3, 198.1, 216, 73, 78–83, 4, 91, 455/102–103, 113, 115.1, 118–119, 123, 455/187.1, 179.1, 197.1; 333/202, 204, 99 S, 333/175; 327/527; 505/210; 331/42
See application file for complete search history.

(56) References Cited

U.S. PATENT DOCUMENTS

| | | | |
|---|---|---|---|
| 6,107,898 A | 8/2000 | Rauscher | |
| 6,518,854 B2 | 2/2003 | Kayano | |
| 6,567,648 B1* | 5/2003 | Ahn et al. | ............ 455/83 |
| 6,636,128 B2* | 10/2003 | Rauscher | ............ 333/175 |
| 7,253,701 B2* | 8/2007 | Smith et al. | ............ 333/100 |
| 7,295,090 B2 | 11/2007 | Kayano et al. | |
| 7,323,955 B2* | 1/2008 | Jachowski | ............ 333/204 |
| 7,676,252 B2* | 3/2010 | Kayano | ............ 505/210 |
| 7,719,384 B1* | 5/2010 | Arceo et al. | ............ 333/132 |
| 7,855,620 B2* | 12/2010 | Kayano | ............ 333/202 |

(Continued)

FOREIGN PATENT DOCUMENTS

| | | |
|---|---|---|
| JP | 2002-513227 | 5/2002 |
| JP | 3380165 | 12/2002 |
| WO | WO 99/56339 | 11/1999 |

OTHER PUBLICATIONS

M. Honjoh, et al., "Synthesis of Microwave Circuits by Normal Mode Expansion-Synthesis of Rectangular Waveguide Filter with Dielectric Sheet Window", IEICE Technical Report, MW82-54, 1982 pp. 9-16.

(Continued)

*Primary Examiner* — Pablo N Tran
(74) *Attorney, Agent, or Firm* — Oblon, Spivak, McClelland, Maier & Neustadt, L.L.P.

(57) ABSTRACT

An amplifier includes: an input terminal configured to have an input signal of a center frequency $f_0$ input; a dividing unit that divides the input signal; first through ith blocks configured to have the divided input signal transmitted; a combining unit that combines signals transmitted through the blocks; and an output terminal that outputs the signals combined by the combining unit. The nth block includes a nth former-stage resonator having a fundamental resonant frequency $f_n$, a nth amplifying unit, a nth latter-stage resonator having the fundamental resonant frequency $f_n$, and a nth phase adjusting unit. Each latter-stage resonator having a harmonic resonant frequency either $f_a$ or $f_b$, satisfies relationship $f_a<2f_1$, $f_b>2f_1$, $(f_a+f_b)/2=2f_0$ The phase adjusting unit is configured to reverse the phase of signals passing adjacent blocks and maintain all phase differences among signals of $2f_n$ passing through the nth block in the coordinate-phase.

20 Claims, 17 Drawing Sheets

U.S. PATENT DOCUMENTS

| | | |
|---|---|---|
| 7,889,021 B2 * | 2/2011 | Maiuzzo .................... 333/12 |
| 2004/0041635 A1 | 3/2004 | Sano et al. |
| 2007/0001787 A1 | 1/2007 | Kayano |
| 2007/0241814 A1 | 10/2007 | Kayano |
| 2008/0068113 A1 | 3/2008 | Kayano |

OTHER PUBLICATIONS

Takayuki Kato, et al., "Studies on the equivalent circuits of dual-mode rectangular waveguide filters using HFSS and MDS", IEICE Technical Report, MW98-85, Sep. 1998, pp. 73-80 (with English Abstract).

Steve Cripps, "Predistortion Techniques", pp. 153-156, andFeedforward Power Amplifiers pp. 197-203, Advanced Techniques in RF Power Amplifier Design, Artech House (ISBN-13:978-1580532822), 2002.

* cited by examiner

AMPLIFIER, RADIO TRANSMITTING APPARATUS, AND RADIO RECEIVING APPARATUS

CROSS-REFERENCE TO RELATED APPLICATION

This application is based upon and claims the benefit of priority from Japanese Patent Application No. 2007-246551, filed on Sep. 25, 2007, the entire contents of which are incorporated herein by reference.

FIELD OF THE INVENTION

The present invention relates to an amplifier that is used in, for example, a radio communication device and is capable of efficiently amplifying signals with little distortion, and a radio transmitting device and a radio receiving device that include such an amplifier.

BACKGROUND OF THE INVENTION

Amplifiers are used to amplify signals to obtain desired field intensity. In a case where desired electric power cannot be obtained with only one amplifying device, two or more amplifying devices are connected in parallel, and the outputs of the amplifying devices are combined in the coordinate-phase, so as to obtain desired power (see "Advanced Techniques in RF Power Amplifier Design", by Steve Cripps, Artech House, 2002 (ISBN-13: 978-1580532822), for example).

Since amplifying devices used in amplifiers have nonlinearity, those amplifying devices have the problem of outputting signals accompanied by nonlinear distortion. To counter this problem, amplifying devices may be operated in low-output regions with high linearity. In doing so, however, another problem is caused, as the efficiency becomes much lower in the low-output regions.

To counter those problems, a push-pull technique has been suggested. By the push-pull technique, nonlinear amplifying devices are connected in parallel, so as to operate amplifiers with high efficiency. Linear outputs are then obtained by varying the periods of time for operating the respective amplifying devices. Alternatively, it is possible to employ a technique of using a linearizer circuit for erasing distortion that is output from nonlinear amplifying devices. By a regular technique of using a linearizer circuit, signals having the opposite distortion of that of amplifying devices are provided in advance, and signals formed by adding the signals having the opposite distortion to input signals are supplied to the amplifiers. This circuit is called a predistortion-type linearizer circuit.

There is also a feedforward-type linearizer circuit that extracts distorted signals from output signals of amplifying devices, generates the reverse-distorted signals based on the extracted distorted signals, and subtracts the reverse-distorted signals from the output signals of the amplifying devices, so as to eliminate the distortion (See "Advanced Techniques in RF Power Amplifier Design", by Steve Cripps, Artech House, 2002 (ISBN-13: 978-1580532822), for example). There is also a technique of dividing signals on a frequency axis with the use of two different bandpass filters (see JP-A 2002-513227(KOKAI), for example).

By any of the above techniques, intermodulation distortion existing close to the signal band can be reduced, but harmonic distortion cannot be eliminated. Therefore, conventionally, a low-pass filter is added in a stage behind the amplifier, so as to eliminate harmonic distortion. However, the addition of a low-pass filter causes the problem of an increase in power loss.

SUMMARY OF THE INVENTION

An amplifier according to an embodiment of the present invention includes: an input terminal configured to have an input signal of a center frequency $f_0$ input thereto; a dividing unit that is connected to the input terminal and divides the input signal; first through ith (i being an even number of 2 or greater) blocks that are connected in parallel to the dividing unit, respectively, and have the divided input signal transmitted thereto; a combining unit that is connected to the first through ith blocks and combines signals transmitted through the first through ith blocks; and an output terminal that is connected to the combining unit and outputs the signals combined by the combining unit. The nth block (n being an integer between 1 and i) includes a nth former-stage resonator having a fundamental resonant frequency $f_n$, a nth amplifying unit configured to amplify a signal transmitted through the nth former-stage resonator, a nth latter-stage resonator having the fundamental resonant frequency $f_n$, and a nth phase adjusting unit, with the signal transmitted through the nth amplifying unit being transmitted through the nth latter-stage resonator. The fundamental resonant frequency $f_m$ (m being an integer between 1 and i−1) satisfies the relationship, $f_m \leq f_{(m+1)}$. Each nth latter-stage resonator is either a jth latter-stage resonator (j being i/2 integers selected from 1 to i) having a harmonic resonant frequency $f_{aj}$ lower than $2f_1$, or a kth latter-stage resonator (k being i/2 integers selected from 1 to i, except for j) having a harmonic resonant frequency $f_{bk}$ higher than $2f_i$. A kth latter-stage resonator which has a harmonic resonant frequency $f_{bk}$ exists that satisfies the relationship of $(f_{aj}+f_{bk})/2=2f_0$ for each jth latter-stage resonator. The mth phase adjusting unit (m being an integer between 1 and i−1) is configured to reverse a phase of a phase difference between a signal of the fundamental resonant frequency $f_m$ passing through the mth block and a signal of the fundamental resonant frequency $f_{(m+1)}$ passing through the (m+1)th block. The nth phase adjusting unit (n being an integer between 1 and i) is configured to maintain all phase differences among signals of $2f_n$ passing through the nth block in the coordinate-phase.

A radio transmitting device according to an embodiment of the present invention includes: a signal processing circuit configured to have a signal input thereto; a local signal generator configured to generate a local signal; a frequency converter configured to perform a frequency conversion by multiplying the signal processed at the signal processing circuit by the local signal; an amplifier configured to amplify the signal frequency-converted by the frequency converter; and an antenna configured to transmit the signal amplified by the amplifier. In this radio transmitting device, the amplifier includes: an input terminal configured to have an input signal of a center frequency $f_0$ input thereto; a dividing unit that is connected to the input terminal and divides the input signal; first through ith (i being an even number of 2 or greater) blocks that are connected in parallel to the dividing unit, respectively, and have the divided input signal transmitted thereto; a combining unit that is connected to the first through ith blocks and combines signals transmitted through the first through ith blocks; and an output terminal that is connected to the combining unit and outputs the signals combined by the combining unit. The nth block (n being an integer between 1 and i) includes a nth former-stage resonator having a fundamental resonant frequency $f_n$, a nth amplifying unit configured to amplify a signal transmitted through the nth former-stage resonator, a nth latter-stage resonator having the fundamental resonant frequency $f_n$, and a nth phase adjusting unit, with the signal transmitted through the nth amplifying unit being transmitted through the nth latter-stage resonator. The fundamental resonant frequency $f_m$ (m being an integer between 1 and i−1) satisfies the relationship, $f_m \leq f_{(m+1)}$. Each nth latter-stage resonator is either a jth latter-stage resonator (j being i/2 integers selected from 1 to i) having a harmonic resonant frequency $f_{aj}$ lower than $2f_1$, and a kth latter-stage resonator (k being i/2 integers selected from 1 to i, except for j) having a harmonic resonant frequency $f_{bk}$ higher than $2f_i$. A kth latter-stage resonator which has a harmonic resonant frequency $f_{bk}$ exists that satisfies the relationship of $(f_{aj}+f_{bk})/2=2f_0$ for each jth latter-stage resonator. The mth phase adjusting unit (m being an integer between 1 and i−1) is configured to reverse a phase of a phase difference between a signal of the fundamental resonant frequency $f_m$ passing through the mth block and a signal of the fundamental resonant frequency $f_{(m+1)}$ passing through the (m+1)th block. The nth phase adjusting unit (n being an integer between 1 and i) is configured to maintain all phase differences among signals of $2f_n$ passing through the nth block in the coordinate-phase.

A radio receiving device according to an embodiment of the present invention includes: an antenna configured to have a signal input thereto; an amplifier configured to amplify the signal received through the antenna; a local signal generator configured to generate a local signal; a frequency converter configured to perform a frequency conversion by multiplying the signal amplified at the amplifier by the local signal; and a signal processing circuit configured to perform processing on the signal frequency-converted by the frequency converter. In this radio receiving device, the amplifier includes: an input terminal configured to have an input signal of a center frequency $f_0$ input thereto; a dividing unit that is connected to the input terminal and divides the input signal; first through ith (i being an even number of 2 or greater) blocks that are connected in parallel to the dividing unit, respectively, and have the divided input signal transmitted thereto; a combining unit that is connected to the first through ith blocks and combines signals transmitted through the first through ith blocks; and an output terminal that is connected to the combining unit and outputs the signals combined by the combining unit. The nth block (n being an integer between 1 and i) includes a nth former-stage resonator having a fundamental resonant frequency $f_n$, a nth amplifying unit configured to amplify a signal transmitted through the nth former-stage resonator, a nth latter-stage resonator having the fundamental resonant frequency $f_n$, and a nth phase adjusting unit, with the signal transmitted through the nth amplifying unit being transmitted through the nth latter-stage resonator. The fundamental resonant frequency $f_m$ (m being an integer between 1 and i−1) satisfies the relationship, $f_m \leq f_{(m+1)}$. Each nth latter-stage resonator is either a jth latter-stage resonator (j being i/2 integers selected from 1 to i) having a harmonic resonant frequency $f_{aj}$ lower than $2f_1$, or a kth latter-stage resonator (k being i/2 integers selected from 1 to i, except for j) having a harmonic resonant frequency $f_{bk}$ higher than $2f_i$. A kth latter-stage resonator which has a harmonic resonant frequency $f_{bk}$ exists that satisfies the relationship of $(f_{aj}+f_{bk})/2=2f_0$ for each jth latter-stage resonator. The mth phase adjusting unit (m being an integer between 1 and i−1) is configured to reverse a phase of a phase difference between a signal of the fundamental resonant frequency $f_m$ passing through the mth block and a signal of the fundamental resonant frequency $f_{(m+1)}$ passing through the (m+1)th block. The nth phase adjusting unit (n being an integer between 1 and i) is configured to maintain all phase differences among signals of $2f_n$ passing through the nth block in the coordinate-phase.

DETAILED DESCRIPTION OF THE EMBODIMENTS

Figure 1:
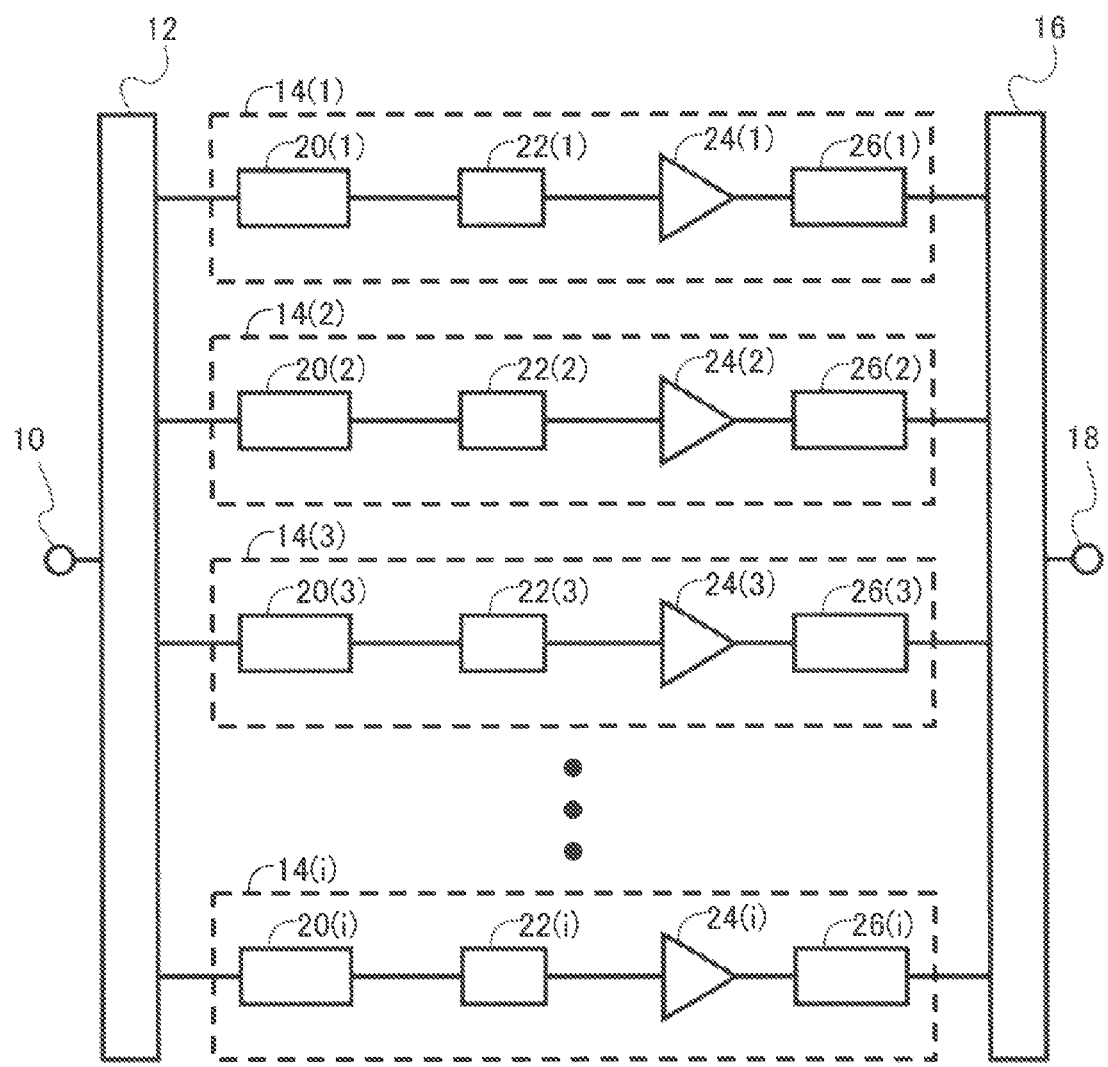
FIG. 1 is a schematic block diagram of an amplifier according to a first embodiment of the present invention.

The following is a description of embodiments of the present invention, with reference to the accompanying drawings.

Embodiment 1

An amplifier of a first embodiment of the present invention includes: an input terminal to which input signals of a center frequency $f_0$ are input; a dividing unit that is connected to the input terminal, and divides the input signals; first through ith (i being an even number of 2 or greater) blocks that are connected in parallel to the dividing unit, respectively, and have the divided input signals transmitted thereto; a combining unit that is connected to the first through ith blocks, and combines the signals transmitted through the first through ith blocks; and an output terminal that is connected to the combining unit, and outputs the signals combined by the combining unit. Each nth block (n being an integer between 1 and i) includes: an nth former-stage resonator that has a fundamental resonant frequency $f_n$; an nth amplifying unit that amplifies each signal transmitted through the nth former-stage resonator; an nth latter-stage resonator that transmits each signal passing through the nth amplifying unit, and has the fundamental resonant frequency $f_n$; and an nth phase adjusting unit. Here, the fundamental resonant frequency $f_m$ (m being integers from 1 to i−1) satisfies the relationship, $f_m \leq f_{(m+1)}$. The nth latter-stage resonator is either a jth latter-stage resonator (j being i/2 integers selected from 1 to i) that has a harmonic resonant frequency $f_{aj}$ lower than $2f_1$, or a kth latter-stage resonator (k being i/2 integers selected from 1 to i, except for j) that has a harmonic resonant frequency $f_{bk}$ higher than $2f_i$. There exist kth latter-stage resonators having the harmonic resonant frequency $f_{bk}$ that satisfies the relationship with respect to each jth latter-stage resonator, $(f_{aj}+f_{bk})/2=2f_0$. The mth phase adjusting unit (m being an integer between 1 and i−1) reverses the phase of the phase difference between each signal of the fundamental resonant frequency $f_m$ passing through the mth block and each signal of the fundamental resonant frequency $f_{(m+1)}$ passing through the (m+1)th block. The nth phase adjusting unit (n being an integer between 1 and i) maintains the phase differences among the signals of $2f_n$ passing through the nth block in the coordinate-phase.

Having the above structure, the amplifier of this embodiment efficiently reduces harmonic distortion and intermodulation distortion caused in the amplifier. More specifically, the harmonic distortion caused in the amplifier at each of the blocks is classified as distortion of a frequency fa group or distortion of a frequency fb group in each block. The classified signals are combined in the coordinate-phase, respectively, so as to reduce the harmonic distortion with high efficiency. Also, in each block, the signals are divided into groups of the fundamental frequencies $f_1$ through $f_n$, and are combined in the reversed phase after passing through the latter-stage resonators having the fundamental frequencies $f_1$ through $f_n$. In this manner, the intermodulation distortion is reduced with high efficiency.

FIG. 1 is a schematic block diagram of the amplifier of this embodiment. As shown in FIG. 1, this amplifier includes an input terminal 10, a power divider 12 as a dividing unit, i blocks 14(1) through 14(i) (with the proviso that, i being an even number of 2 or greater), a power combiner 16 as a combining unit, and an output terminal 18.

Input signals of the center frequency $f_0$ are input to the input terminal 10. The power divider 12 is connected to the input terminal 10. The power divider 12 divides the input signals to the blocks 14(1) through 14(i) connected in parallel to the power divider 12, respectively. Each of the blocks 14(1) through 14(i) is connected to the power combiner 16, respectively. The signals that have passed through the blocks 14(1) through 14(i) are combined by the power combiner 16. The combined signal is output as an amplified output signal of the center frequency $f_0$ from the output terminal 18 connected to the power combiner 16.

The nth block 14(n) (n being an integer between 1 and i) includes a nth former-stage resonator 20(n), a transmitting line unit 22(n) as a nth phase adjusting unit, a nth amplifying unit 24(n), and a nth latter-stage resonator 26(n).

The former-stage resonator 20(n) has the fundamental resonant frequency $f_n$. The former-stage resonator 20(n) is connected to the power divider 12, and receives an input signal divided by the power divider 12. The former-stage resonator 20(n) is connected to the transmitting line unit 22(n).

The signal that has passed through the former-stage resonator 20(n) also passes through the transmitting line unit 22(n), and is transmitted to the amplifying unit 24(n) connected to the transmitting line unit 22(n). Like the former-stage resonator 20(n), the amplifying unit 24(n) is connected to the latter-stage resonator 26(n) having the fundamental resonant frequency $f_n$. The signal amplified by the amplifying unit 24(n) passes through the latter-stage resonator 26(n), and is transmitted to the power combiner 16 connected to the latter-stage resonator 26(n).

The connection order of the transmitting line unit 22(n) and the amplifying unit 24(n) may be arbitrarily reversed. The amplifying unit 24(n) may be connected to the previous-stage side of the transmitting line unit 22(n).

The fundamental resonant frequency $f_m$ (m being an integer between 1 and i−1) satisfies the relationship, $f_m \leq f_{(m+1)}$ or $f_1 < f_2 < f_3 < \ldots < f_i$. The differences among the respective fundamental resonant frequencies may be the same or may not be the same.

In FIG. 1, the blocks 14(1) through 14(i) are arranged in the ascending order of the fundamental resonant frequencies from the top toward the bottom of the drawing. However, the blocks 14(1) through 14(i) may be arbitrarily arranged, regardless of the fundamental resonant frequencies.

Each latter-stage resonator 26(n) has either a first harmonic resonant frequency $f_a$ or a 2nd harmonic resonant frequency $f_b$, as well as the fundamental resonant frequency $f_n$. More specifically, a jth latter-stage resonator (j being an integer between 1 and i/2) has the first harmonic resonant frequency $f_a$, and a kth latter-stage resonator (k being an integer between i/2+1 and i) has the 2nd harmonic resonant frequency $f_b$.

In other words, each of the latter-stage resonators 26(n) of the lower half of the fundamental resonant frequencies has the first harmonic resonant frequency $f_a$, and each of the latter-stage resonators 26(n) of the higher half of the fundamental resonant frequencies has the 2nd harmonic resonant frequency $f_b$.

Here, $f_a$, $f_b$, and $f_0$ satisfy the following relationships: $f_a < 2f_1$, $f_b > 2f_i$, and $(f_a+f_b)/2=2f_0$. In the relationship, $(f_a+f_b)/2=2f_0$, $(f_a+f_b)/2$ may not be exactly equal to $2f_0$, and may be almost equal to $2f_0$. More specifically, $(f_a+f_b)/2$ should be in the range of $2f_0 \pm$ modulation bandwidth. Here, the modulation bandwidth is the occupied bandwidth of power depending on the data transfer rate and method allotted to an input signal.

In this embodiment, each of the latter-stage resonators 26(n) of the lower half of the fundamental resonant frequencies has the first harmonic resonant frequency $f_a$, and each of the latter-stage resonators 26(n) of the higher half of the fundamental resonant frequencies has the 2nd harmonic resonant frequency $f_b$, for ease of explanation. However, the present invention is not limited to that arrangement, and the same effects as above can be achieved, as long as a half of the latter-stage resonators each have the first harmonic resonant frequency $f_a$ while the other half of the latter-stage resonators each have the 2nd harmonic resonant frequency $f_b$.

Each mth transmitting line unit 22(m) as a mth phase adjusting unit (m being an integer between 1 and i−1) has the function of reversing the phase of the phase difference between a signal of the fundamental resonant frequency $f_m$ passing through the block 14(m) and a signal of the fundamental resonant frequency $f_{(m+1)}$ passing through the block 14(m+1). Accordingly, each transmitting line unit 22(n) of the blocks 14(n) is designed so that signals output from each two blocks having adjacent fundamental resonant frequencies have the opposite phases from each other. At the same time, each transmitting line unit 22(n) as a nth phase adjusting unit (n being an integer between 1 and i) is designed to maintain the phase differences among the signals of $2f_n$ as harmonic frequencies passing through the transmitting line unit 22(n) in the coordinate-phase.

In this specification, when the fundamental frequencies of two signals have the opposite phases, the phase difference between the two signals is not necessarily 180+360×n degrees (n being an integer equal to or greater than 0), but may indicate almost the opposite phases. However, it is preferable that the phase difference is within the range of (180±15)+360×n degrees (n being an integer equal to or greater than 0).

When the harmonic frequencies of two signals have the coordinate-phases, the phase difference between the two signals is not necessarily 360+720×n degrees (n being an integer equal to or greater than 0), but may indicate almost the coordinate-phases. However, it is preferable that the phase difference is within the range of (360±30)+720×n degrees (n being an integer equal to or greater than 0). As long as the phase difference is within those ranges, the signal distortion removing effect in this embodiment is not greatly reduced.

In this embodiment, each of the latter-stage resonators 26(n) of the lower half of the fundamental resonant frequencies has the first harmonic resonant frequency $f_a$, and each of the latter-stage resonators 26(n) of the higher half of the fundamental resonant frequencies has the 2nd harmonic resonant frequency $f_b$. However, as long as a half of the nth latter-stage resonators each have the first harmonic resonant frequency $f_a$ while the other half of the nth latter-stage resonators each have the 2nd harmonic resonant frequency $f_b$, it is possible to define the relationships between the fundamental frequencies and the harmonic resonant frequencies independently of one another.

In this embodiment, the harmonic resonant frequency of each nth latter-stage resonator is either the first harmonic resonant frequency $f_a$ or the 2nd harmonic resonant frequency $f_b$. However, to remove signals of unnecessary frequency bandwidths, it is preferable that all the lower ones of the harmonic resonant frequencies indicate the same frequency, while all the higher ones indicate the same frequency.

However, all the lower ones may not necessarily have the same frequency, and all the higher ones may not have the same frequency, if each nth latter-stage resonator is either a j th latter-stage resonator having a harmonic resonant frequency $f_{aj}$ (j being i/2 integers selected from 1 to i) lower than $2f_1$ or a kth latter-stage resonator having a harmonic resonant frequency $f_{bk}$ (k being i/2 integers selected from 1 to i, except for j) higher than $2f_1$, and there exist some kth latter-stage resonators having such a harmonic resonant frequency $f_{bk}$ as to satisfy the relationship with respect to any jth latter-stage resonator, $(f_{aj}+f_{bk})/2=2f_0$. This is because the later described harmonic distortion removing effect can be achieved with such a structure.

In this embodiment, each nth phase adjusting unit (n being an integer between 1 and i) is a transmitting line such as a microstrip line. Since the simplicity of its structure, a transmitting line is preferred. However, as long as the phase conversions with respect to the fundamental frequencies and the harmonic frequencies satisfy the above described requirements, each nth phase adjusting unit may not necessarily be a transmitting line, but may be a circuit or the like formed with an inductance and a capacitance, for example.

Next, an operation of the amplifier having the structure illustrated in FIG. 1 is described. During an operation performed by the amplifier illustrated in FIG. 1, input signals of the center frequency $f_0$ are input to the input terminal 10 from the outside. The input signals are divided to the blocks 14(1) through 14(i) by the power divider 12.

The signals divided and input to the blocks 14(1) through 14(i) are extracted as the signals corresponding to the resonant frequencies $f_1, f_2, \ldots f_i$ of the former-stage resonators 20(1) through 20(i), from the former-stage resonators 20(1) through 20(i). The signals extracted from the former-stage resonators 20(1) through 20(i) are transmitted to the amplifying units 24(1) through 24(i) via the transmitting line units 22(1) through 22(i). The signals transmitted to the amplifying units 24(1) through 24(i) are amplified in accordance with the respective gains of the amplifying units 24(1) through 24(i).

At the time of amplifying, intermodulation distortion is caused, but is restricted to a small amount for the later described reasons. Further, the amplified signals are transmitted to the latter-stage resonators 26(1) through 26(i). Since the latter-stage resonators 26(1) through 26(i) have the same frequencies as the resonant frequencies $f_1, f_2, \ldots f_i$ of the former-stage resonators 20(1) through 20(i), respectively, the intermodulation distortion caused at the amplifying units 24(1) through 24(i) is removed.

Figure 2:
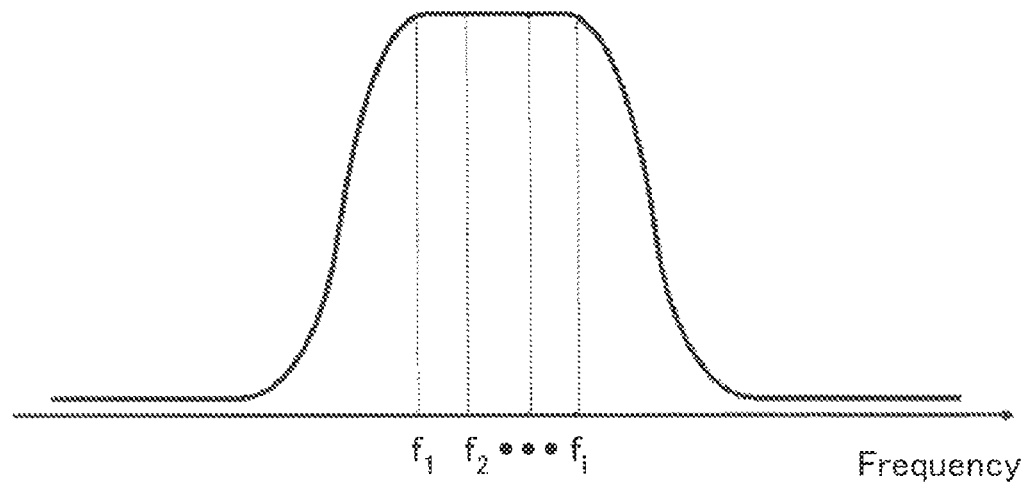
FIG. 2 shows an example of an output signal of the amplifier according to the first embodiment.

The signals having the intermodulation distortion removed by the latter-stage resonators 24(1) through 24(i) are then transmitted to the power combiner 16. The signals input to the power combiner 16 are output as a combined signal from the output terminal 18. Meanwhile, the 2nd harmonic distortion signals generated at the amplifying units 24(1) through 24(i) are transmitted from the latter-stage resonators 26(1) through 26(i) to the power combiner 16. By virtue of the later described effects, the 2nd harmonic distortion is removed in this process. FIG. 2 shows an example of an output signal obtained when a modulation signal is input as an input signal to the amplifier illustrated in FIG. 1.

The harmonic distortion removing effect of the amplifier illustrated in FIG. 1 is now described in detail.

Figure 3:
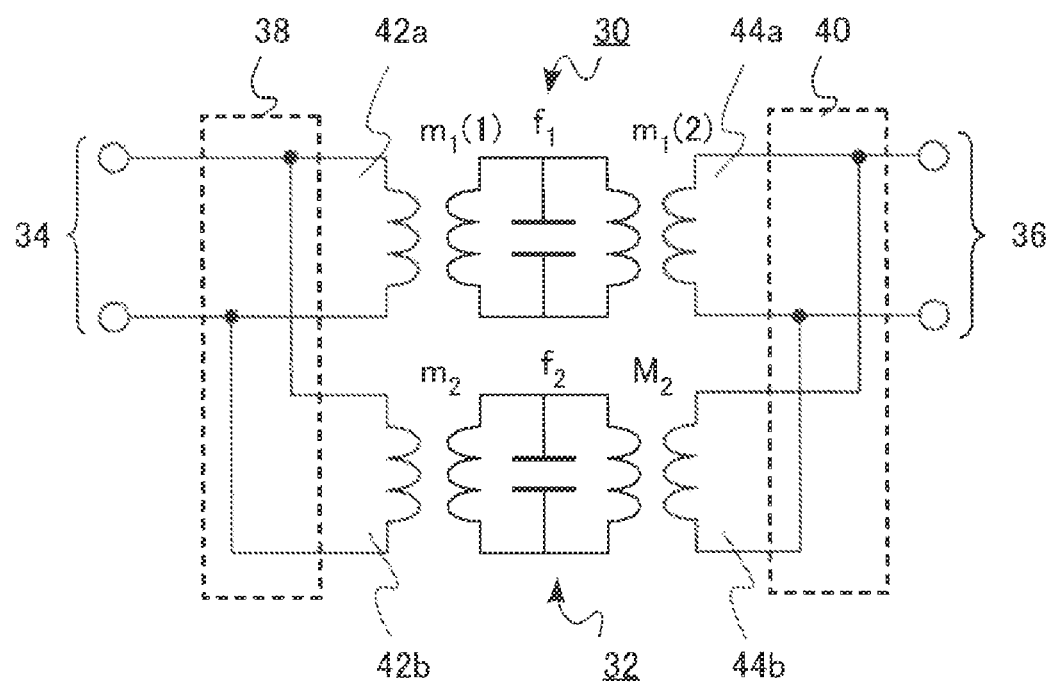
FIG. 3 is a circuit diagram for explaining the principles of power combining.

FIG. 3 is a circuit diagram for illustrating the principles of power combining. In the circuit illustrated in FIG. 3, a resonator 30 having the resonant frequency $f_1$ and a resonator 32 having the resonant frequency $f_2$ are connected in parallel. The circuit illustrated in FIG. 3 includes an input terminal 34, an output terminal 36, a power divider 38, a power combiner 40, a coupling circuit 42a that couples the resonator 30 to the power divider 38, a coupling circuit 42b that couples the resonator 32 to the power divider 38, a coupling circuit 44a that couples the resonator 30 to the power combiner 40, and a coupling circuit 44b that couples the resonator 32 to the power combiner 40.

Figure 4:
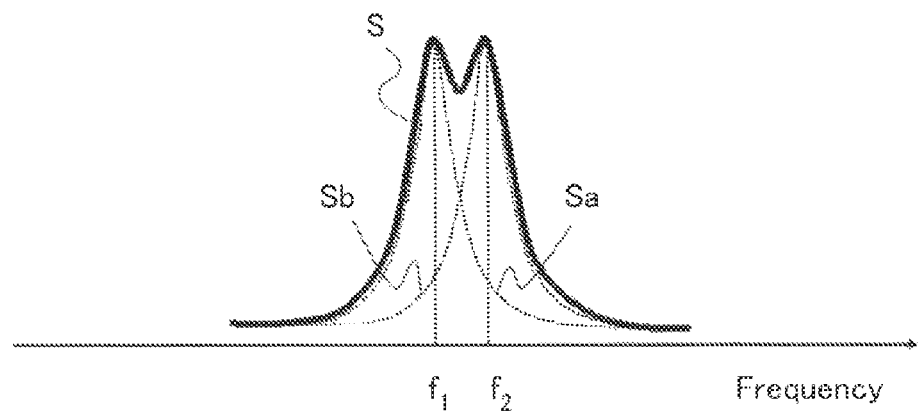
FIG. 4 illustrates the frequency responses observed in a case of opposite-phase coupling.

FIG. 4 illustrates the frequency response observed when a signal is input to the input terminal 34 in a case where the coupling $M_2$ between the resonator 32 and the coupling circuit 44b is opposite-phase coupling (or the phase reverses 180 degrees). Here, Sa represents the signal extracted at the resonator 30, Sb represents the signal extracted at the resonator 32, and S represents the combined signal output from the output terminal 36.

Figure 5:
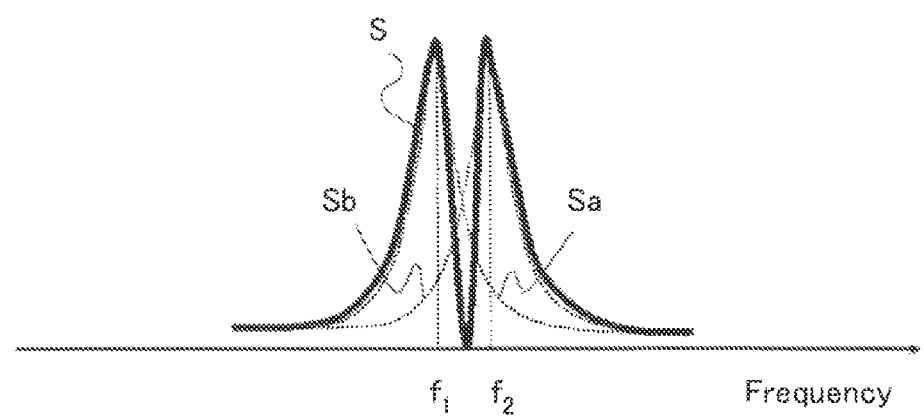
FIG. 5 illustrates the frequency responses observed in a case of coordinate-phase coupling.

FIG. 5 illustrates the frequency response observed when a signal is input to the input terminal 34 in a case where the coupling $M_2$ between the resonator 32 and the coupling circuit 44b is coordinate-phase coupling (or the phase does not vary). In FIG. 5, Sa represents the signal extracted at the resonator 30, Sb represents the signal extracted at the resonator 32, and S represents the combined signal output from the output terminal 36, as in FIG. 4.

Here, the coupling $m_1(1)$ between the resonator 30 and the coupling circuit 42a, the coupling $m_1(2)$ between the resonator 30 and the coupling circuit 44a, and the coupling $m_2$ between the resonator 32 and the coupling circuit 42b are coordinate-phase coupling.

In a case where the coupling M2 between the resonator 32 and the coupling circuit 44b is coordinate-phase coupling, or where the two signals to be combined are in the coordinate-phase, the signal intensity in the vicinity of the center frequency in the target band becomes lower, and it becomes possible to cause the desired signal to attenuate, as shown in FIG. 5. The reasons for this are as follows.

Signals that are output from a resonator have their phases reversed after the respective resonant frequencies. Therefore, when two signals that are output in the coordinate-phase from the two resonators 30 and 32 having the two different resonant frequencies as shown in FIG. 3 are combined, the signals cancel each other as the phases of the two signals are different in the frequency band between the two different resonant frequencies, as shown in FIG. 5. Accordingly, the signal intensity becomes lower in the vicinity of the mid point of the two different resonant frequencies.

In a case where the coupling $M_2$ between the resonator 32 and the coupling circuit 44b is opposite-phase coupling, or where the two signals to be combined have the opposite phases, the signal intensity becomes higher in the vicinity of the center frequency in the target band as shown in FIG. 4, and a desired signal can be obtained.

According to the above principles of power combining, an amplifier that allows fundamental frequencies to pass but does not allow harmonic distortion having double harmonic frequencies to pass can be realized by forming a phase difference of the opposite phases in combining fundamental frequencies and forming a phase difference of the coordinate-phases in combining double harmonic frequencies.

Figure 6:
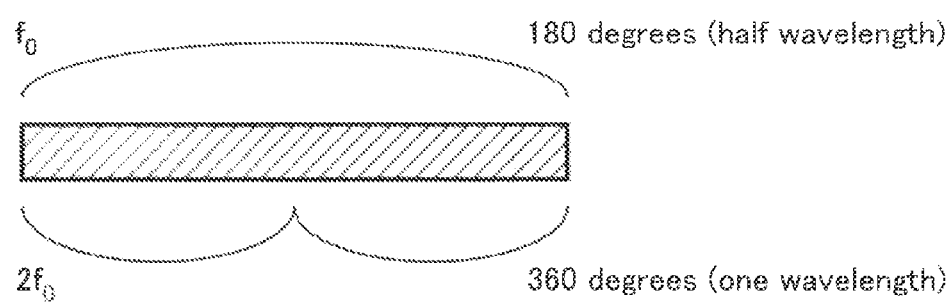
FIG. 6 shows a specific example of a transmitting lines according to the first embodiment.

To obtain a desired output signal in the amplifier illustrated in FIG. 1, the transmitting line units 22(1) through 22(i) as the phase adjusting units are designed so that the signals passing through each two blocks having adjacent resonant frequencies are in the opposite phases with fundamental waves, but are in the coordinate-phase in 2nd harmonics, as described above. FIG. 6 shows a specific example of a transmitting line having such characteristics.

FIG. 6 illustrates a transmitting line formed with a microstrip line that is at 180 degrees in fundamental waves. The transmitting line of the microstrip line that is at 180 degrees in fundamental waves has the phase rotating 360 degrees at 2nd harmonic frequency. The transmitting line of the microstrip line that is at 180 degrees with fundamental waves is added to one of the transmitting line units of each two blocks having adjacent resonant frequencies, so that the signals passing through each two blocks having adjacent resonant frequencies are in the opposite phases in fundamental waves, but are in the coordinate-phase in 2nd harmonics.

Figure 7:
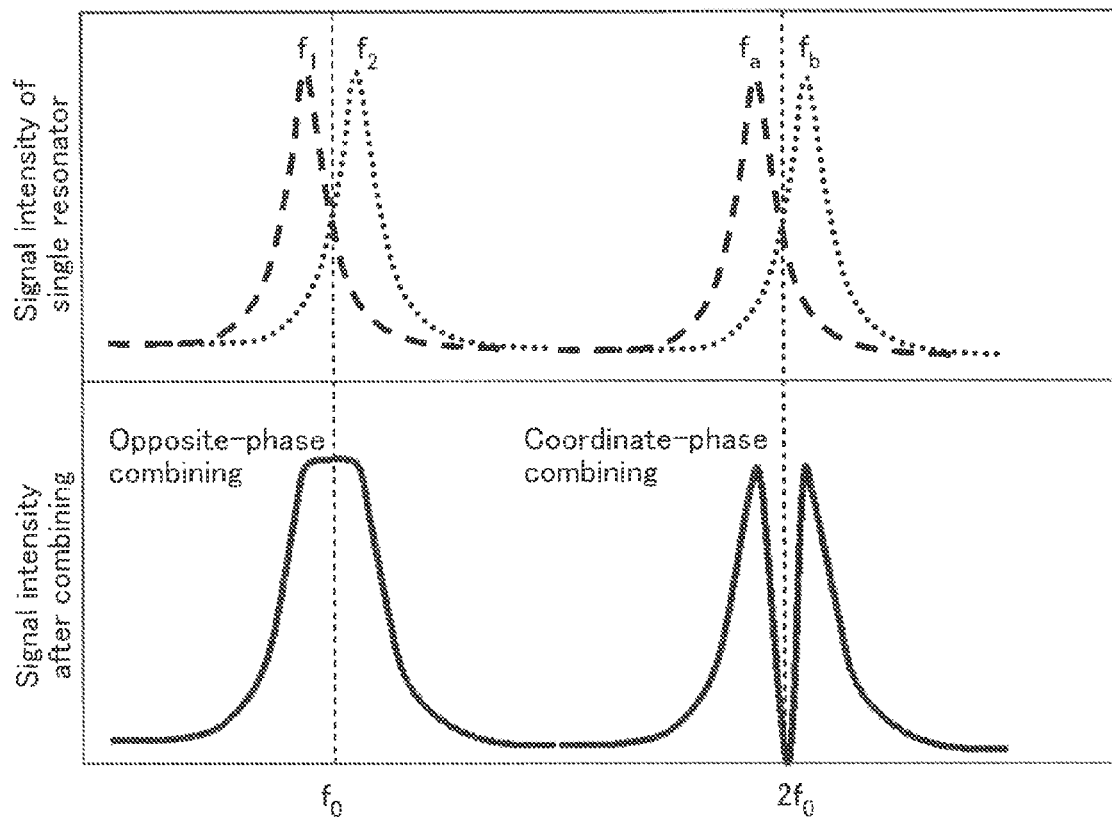
FIG. 7 shows the frequency responses observed in an amplifier (i=2) according to the first embodiment.

FIG. 7 shows the frequency response observed in a case where the amplifier of FIG. 1 includes this transmitting line, and i is 2. The fundamental frequency of the output of the block 14(1) is $f_1$, and the fundamental frequency of the output of the block 14(2) is $f_2$. Since those two output signals have the opposite phases, sum combining is performed.

The 2nd harmonic frequencies of the outputs of the block 14(1) and 14(2) are the harmonic frequencies $f_a$ and $f_b$ extracted by the latter-stage resonators 26(1) and 26(2), respectively. Since the 2nd harmonic frequencies are maintained in the coordinate-phase by the transmitting line units 22(1) and 22(2), the combining of the harmonic frequencies $f_a$ and $f_b$ is difference combining.

Accordingly, the signals at the mid point of the resonant frequencies $f_a$ and $f_b$ cancel each other, and 2nd harmonic attenuation is caused. As a result, the harmonic distortion caused at the amplifying units 24(1) and 24(2) attenuates due to the difference combining, and is removed from the output signal.

Next, specific examples of the latter-stage resonators 26(1) through 26(i) of the amplifier illustrated in FIG. 1 are described. As described above, each nth latter-stage resonator 26(n) is required to have the harmonic resonant frequency $f_a$ or $f_b$ with respect to the fundamental resonant frequency $f_n$. Therefore, in each nth latter-stage resonator 26(n), it should be possible to set the fundamental resonant frequency and the harmonic resonant frequency independently of each other.

Figure 8:
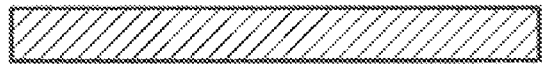
FIG. 8 shows a resonator pattern using a straight line type microstrip line.

FIG. 8 shows a resonator pattern that has a general straight line type microstrip line of half wavelength. Normally, such a resonator has an open end portion at either end. Accordingly, the 2nd harmonic resonant frequency is higher than twice the fundamental resonant frequency. This is because the number of open end portions varies between fundamental resonance and 2nd harmonic resonance, and the influence of the fringing effect also varies. Accordingly, with the resonator pattern shown in FIG. 8, the latter-stage resonators of this embodiment that are required to reduce the 2nd harmonic resonant frequency to a smaller value than twice the fundamental resonant frequency cannot be provided.

Figure 9:
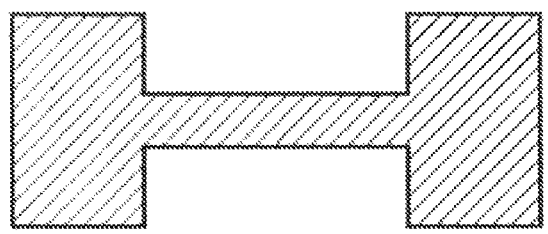
FIG. 9 shows a specific example of a resonator pattern of a latter-stage resonator according to the first embodiment.
Figure 10:
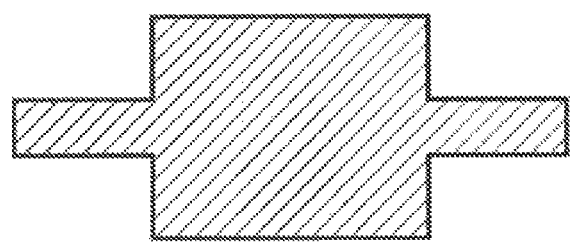
FIG. 10 shows another specific example of a resonator pattern of a latter-stage resonator according to the first embodiment.

FIGS. 9 and 10 show resonator patterns in which the fundamental resonant frequencies and the 2nd harmonic resonant frequencies can be set independently of each other. In each of the resonator patterns, microstrip lines each having different line widths at the center and either end portion are combined. With the different line widths, the inductance (L) and the capacitance (C) of the resonator can be partially changed, and the fundamental resonant frequency and the 2nd harmonic resonant frequency can be set independently of each other.

In a case where a large line width portion, a small line width portion, and a large line width portion are combined or where the width of either end portion is greater than the width of the center portion as shown in FIG. 9, the 2nd harmonic resonant frequency becomes higher than twice the fundamental frequency. In a case where a small line width portion, a large line width portion, and a small line width portion are combined or where the width of either end portion is smaller than the width of the center portion as shown in FIG. 10, the 2nd harmonic resonant frequency becomes lower than twice the fundamental frequency. By combining those resonator patterns as the latter-stage resonators 26(1) through 26(i), the amplifier illustrated in FIG. 1 can be realized.

In this embodiment, microstrip lines are used as resonator patterns. It is preferable to use microstrip line, as it is easy to perform processing with the use of microstrip lines. However, resonators having the same characteristics as above can be formed with cavity resonators, coaxial resonators, dielectric resonators, or the likes, if the resonators are designed to have concavities and convexities therein. Those resonators may be used as the latter-stage resonators.

Figure 11:
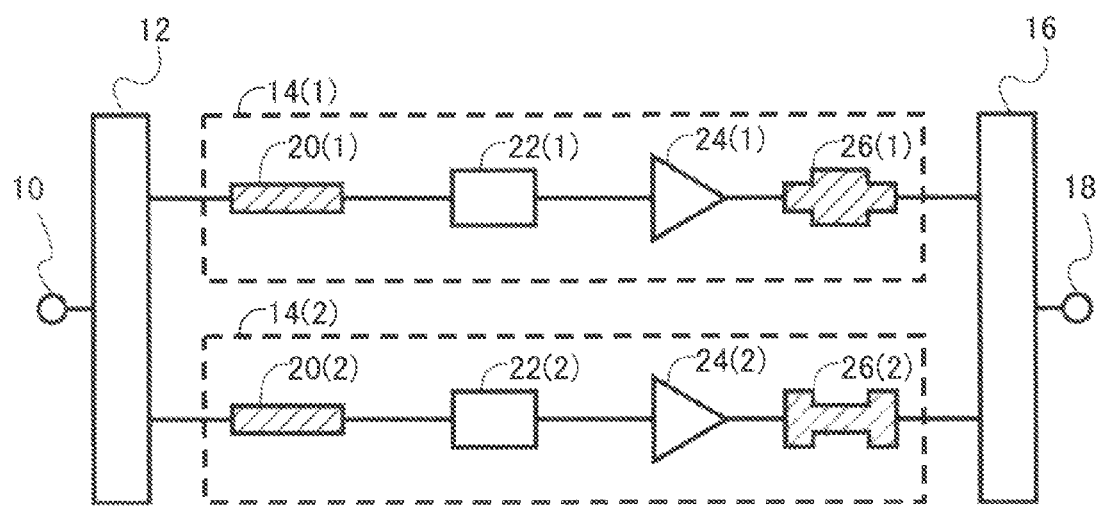
FIG. 11 shows a specific example of the amplifier (i=2) according to the first embodiment.

FIG. 11 is a schematic block diagram illustrating a case where microstrip lines each having a straight-line pattern are employed as the former-stage resonators 20(1) and 20(2), and microstrip lines each having different line widths at the center and end portions are employed as the latter-stage resonators 26(1) and 26(2) in the amplifier illustrated in FIG. 1. In this amplifier, i is 2.

As shown in FIG. 11, microstrip lines of straight-line patterns are used as the former-stage resonators 20(1) and 20(2). With this arrangement, the signals (the fundamental frequencies $f_1$ and $f_2$, and the 2nd harmonic frequencies $f_a$ and $f_b$) passing through the block 14(1) and the block 14(2) are in the opposite phases in fundamental waves, and are in the coordinate-phases in 2nd harmonics.

In the block 14(1), a microstrip line of a pattern in which the width of either end is smaller than the width of the center portion is used as the latter-stage resonator 26(1), and the 2nd harmonic resonant frequency $f_a$ lower than twice the fundamental resonant frequency $f_1$ is realized. On the other hand, a microstrip line of a pattern in which the width of either end is greater than the width of the center portion is used as the latter-stage resonator 26(2), and the 2nd harmonic resonant frequency $f_b$ higher than twice the fundamental resonant frequency $f_2$ is realized.

As described above, in the amplifier illustrated in FIG. 1, fundamental waves are amplified and are allowed to pass, and harmonic distortion caused by the amplifier can be efficiently removed without the use of a low-pass filter or the like.

Next, the intermodulation distortion removing effect of the amplifier illustrated in FIG. 1 is described.

Figure 12:
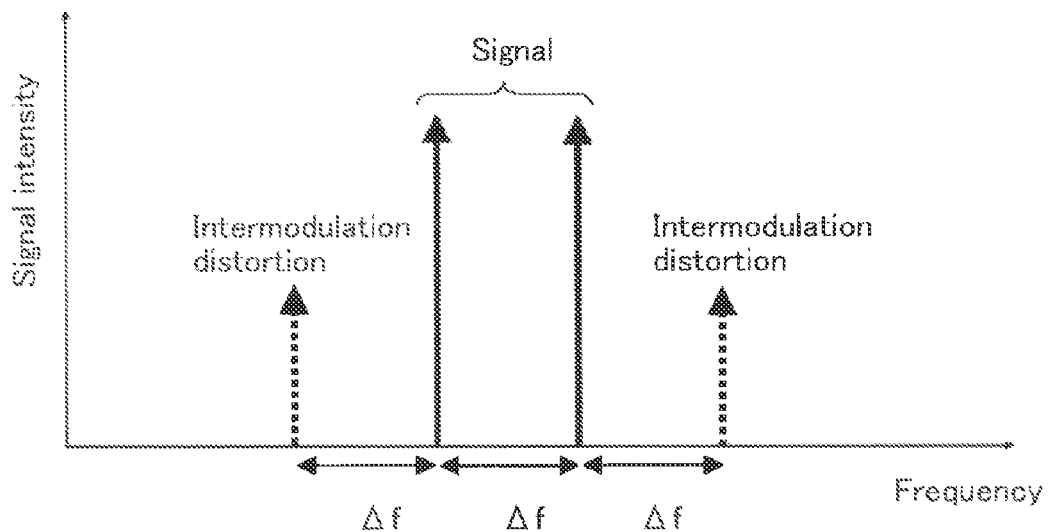
FIG. 12 to FIG. 15 illustrates the effects of the amplifier according to the first embodiment.

FIG. 12 shows an example of the output spectrum observed when two sinusoidal signals having the same signal intensities and different frequencies are input to a nonlinear amplifying device. In FIG. 12, the solid lines indicate the output signal observed when the two input sinusoidal signals are amplified, and the broken lines indicate the third-order intermodulation distortion caused by the two sinusoidal signals. As is apparent from FIG. 12, the third-order intermodulation distortion appears three times as wide as the signal band $\Delta f$ (the difference in frequency between the two sinusoidal signals in this case).

Figure 13:
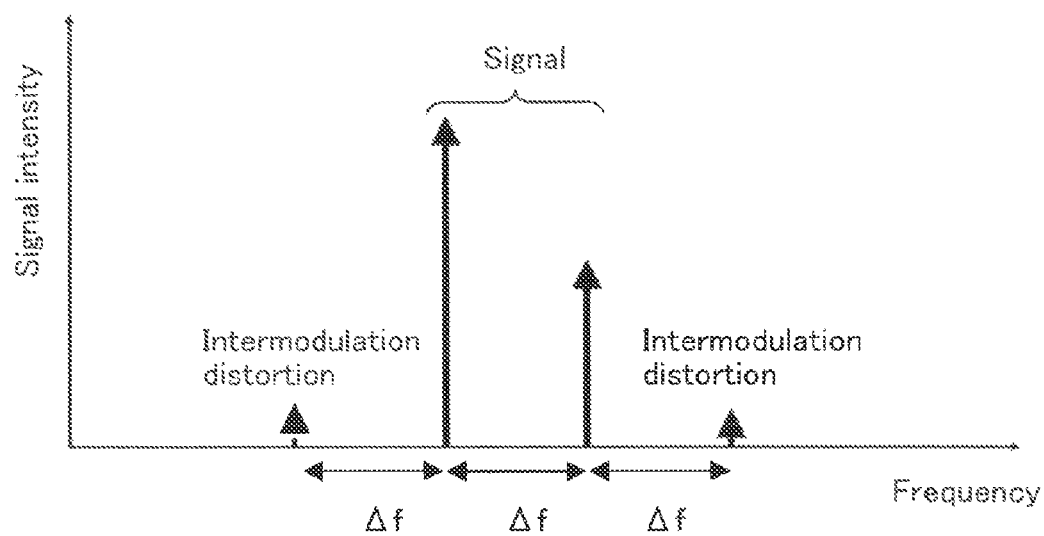

FIG. 13 shows the output spectrum observed when two sinusoidal signals having different signal intensities and different frequencies are input to a nonlinear amplifying device. In this case, one of the signal intensities is the same as those in the case shown in FIG. 12, but the other one is lower than those in the case shown in FIG. 12. As can be seen from FIG. 13, the third-order intermodulation distortion is much smaller than the third-order intermodulation distortion observed in the case shown in FIG. 12. Although not shown in the drawing, the intermodulation distortion of the fifth order or higher is also reduced in this case.

Figure 14:
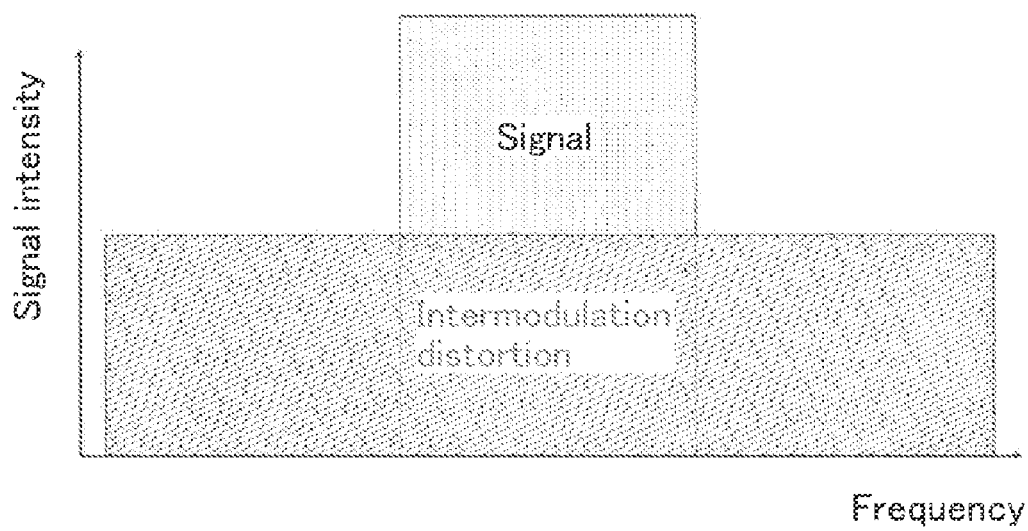

FIG. 14 shows the output spectrum observed when a modulation signal having a band of a certain width and having constant signal intensity in the band is input to a nonlinear amplifying device. As in the case shown in FIG. 12, intermodulation distortion appears in a frequency range three times as wide as the band of the input signal.

Figure 15:
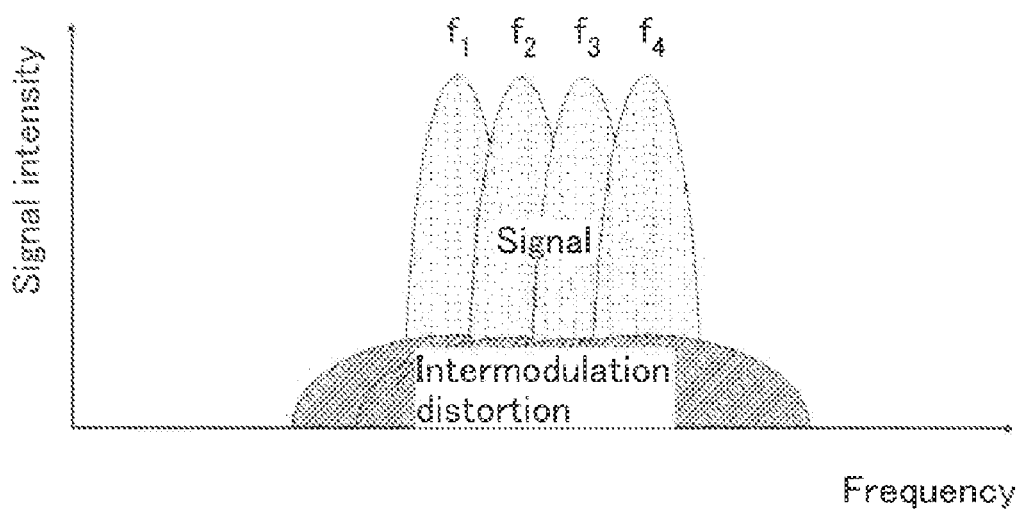

FIG. 15 shows the outputs from the amplifying units 24(1) through 24(4) observed when the same modulation signal as that of FIG. 14 is input to the amplifier shown in FIG. 1 through the input terminal 10. In this amplifier, i is 4. The respective signals passing through the former-stage resonators 20(1) through 20(4) are equivalent to the signals obtained by dividing the input modulation signal into four bands. Each of the signals has a similar shape to a single resonance waveform. Accordingly, the highest signal intensity is observed at each of the center frequencies $f_1$, $f_2$, $f_3$, and $f_4$, and the signal intensity becomes lower at a longer distance from the center. Since each of the signals is obtained by dividing an input modulation signal, each of the signals has a narrower band than the input modulation signal.

As described above, each signal has a similar shape to a single resonance wave form that is resistant to distortion, and has a narrow band. Accordingly, the signal intensity of the intermodulation distortion caused by each signal is low, and the signal band of the intermodulation distortion is narrow. As is apparent from the comparison between FIGS. 14 and 15, an output signal with small intermodulation distortion can be obtained by combining the outputs of the amplifying units 24(1) through 24(4).

Furthermore, in the amplifier (i=4) illustrated in FIG. 1, the latter-stage resonators 26(1) through 26(4) having the same fundamental resonant frequencies as those of the former-stage resonators 20(1) through 20(4) are provided in a stage after the amplifying units 24(1) through 24(4). With this arrangement, the intermodulation distortion caused at the amplifying units 24(1) through 24(4) can be reduced also by the latter-stage resonators 26(1) through 26(4). Thus, the intermodulation distortion of the signal that is output from the output terminal 18 at last can be greatly reduced.

As described above, with the amplifier illustrated in FIG. 1, the harmonic distortion and the intermodulation distortion caused at the amplifying units can be reduced, and signals can be efficiently amplified while only little distortion is caused.

Next, the structures of the power divider 12 and the power combiner 16 of the amplifier illustrated in FIG. 1 are described in detail.

Figure 16:
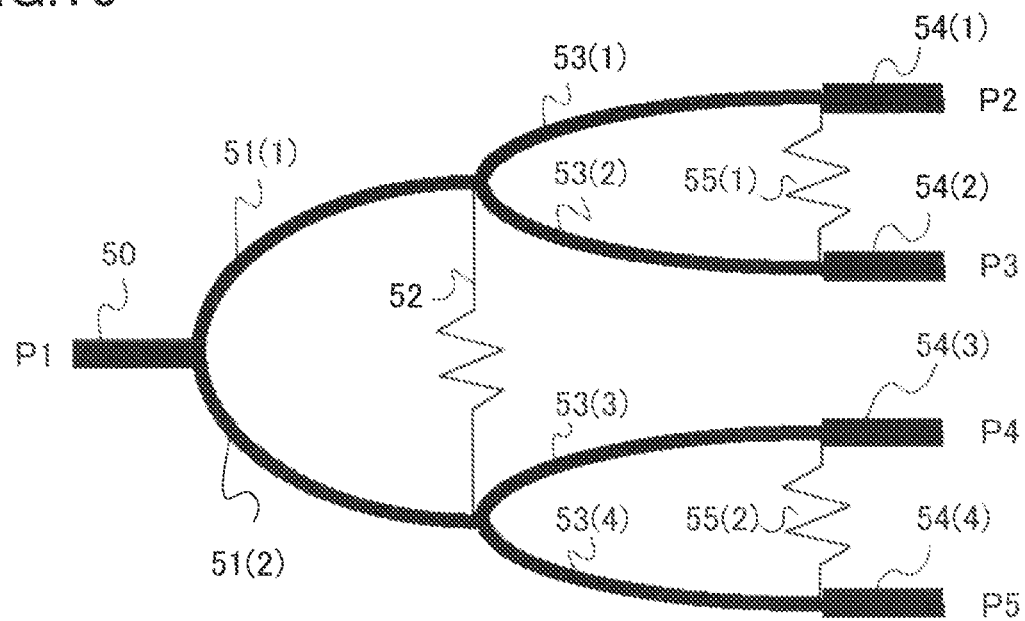
FIG. 16 shows a first specific example of the power divider according to the first embodiment.

FIG. 16 shows a first specific example of the power divider. This power divider is a four-terminal divider having two stages of two-terminal Wilkinson dividers including microstrip lines. For example, an input terminal P1 is provided at one end of a line 50 of 50 Ω, and two lines 51(1) and 51(2) of 70.7 Ω and 1/4 wavelength are connected to the other end of the line 50. The other ends of the lines 51(1) and 51(2) are connected to each other with a resistor 52 of 50 Ω, so as to form a two-terminal divider.

The two-terminal divider is arranged in two stages, so as to realize a four-terminal divider. One end of each of 50-Ω lines 54(1) through 54(4) is connected to each corresponding one of 1/4-wavelength lines 53(1) through 53(4), and output terminals P2 through P5 are provided at the other ends of the 50-Ω lines 54(1) through 54(4). The 55(1) and 55(2) are a resistor of 50Ω. If the terminals P2 through P5 are used as input terminals, and the terminal P1 is used as the output terminal, this structure can be used as the power combiner 16 of the amplifier illustrated in FIG. 1.

Figure 17:
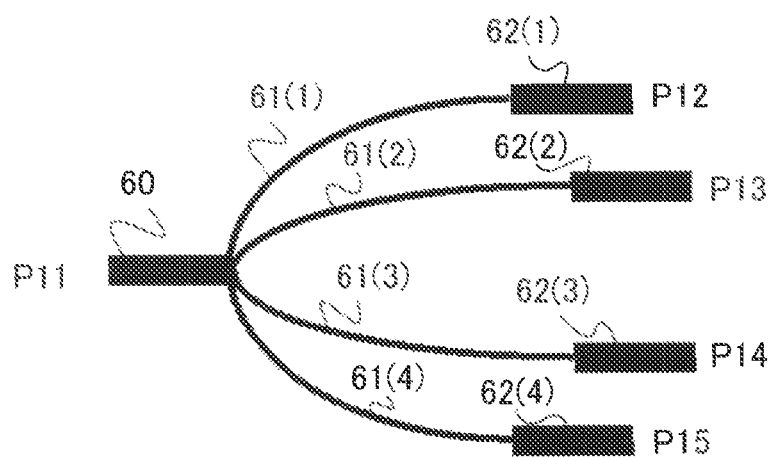
FIG. 17 shows a second specific example of the power divider according to the first embodiment.

FIG. 17 illustrates a second specific example of the power divider. This power divider is a four-terminal divider that sacrifices isolation characteristics but puts emphasis on low loss. An input terminal P11 is provided at one end of a line 60 of 50 Ω, and one end of each of lines 61(1) through 61(4) of 100 Ω and 1/4 wavelength is connected to the other end of the line 60. Lines 62(1) through 62(4) of 50 Ω are connected to the other ends of the lines 61(1) through 61(4). Output terminals P12 through P15 are provided on the output sides of the 50-Ω lines 62(1) through 62(4). If the terminals P12 through P15 are used as input terminals, and the terminal P11 is used as the output terminal, this structure can be used as the power combiner 16 of the amplifier illustrated in FIG. 1, as in the case of the first specific example illustrated in FIG. 16.

Figure 18:
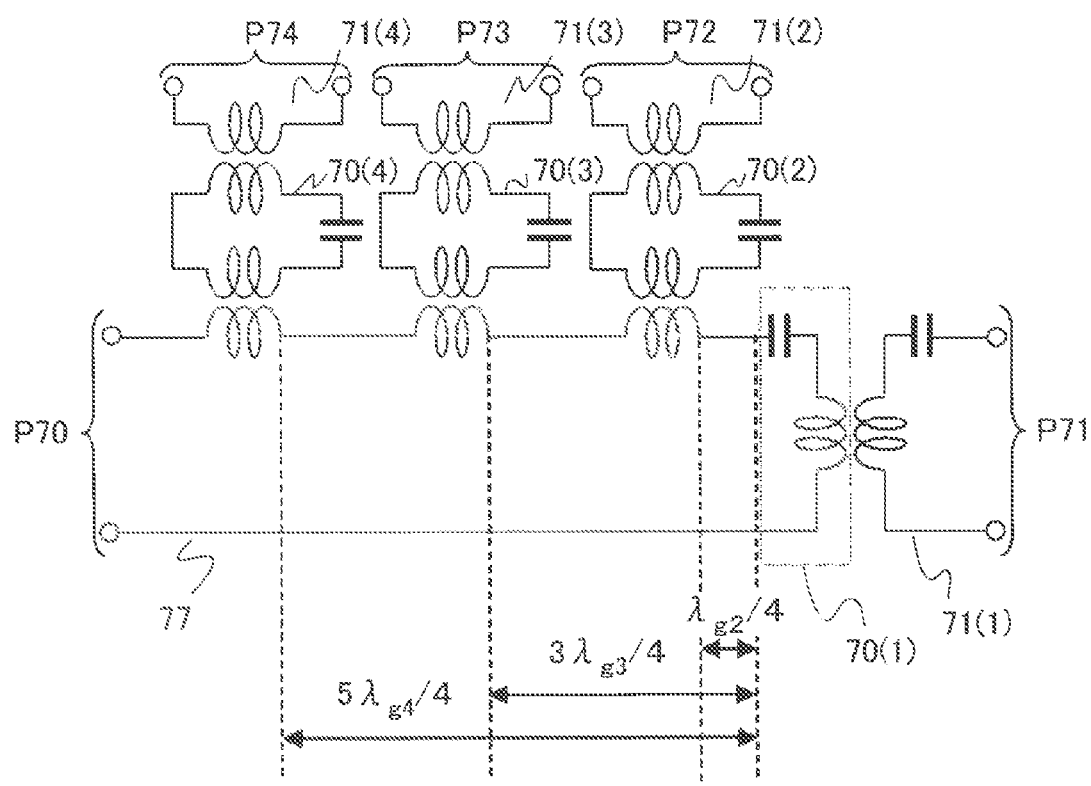
FIG. 18 shows specific examples of the power divider and former-stage resonators according to the first embodiment.

Next, a specific example in which the power divider 12 and the former-stage resonators 20(1) through 20(i) of the amplifier of FIG. 1 are formed as a duplexer is described. FIG. 18 is a circuit diagram of a duplexer. Here, an example of a duplexer to be used in the amplifier illustrated in FIG. 1 (i=4) is described.

A duplexing circuit 77 of this duplexer has a resonant circuit 70(1) that resonates at a resonant frequency $f_1$ at the end portion. This resonant circuit 70(1) is equivalent to the former-stage resonator 20(1) of FIG. 1. Based on a signal that is input through an input terminal P70, the resonant circuit 70(1) resonates, and a resonant signal is output from an output terminal P71 via a coupling circuit 71(1). Here, the coupling circuit 71 is equivalent to the coupling circuit that couples the former-stage resonator 20(1) to the transmitting line unit 22(1) in the amplifier illustrated in FIG. 1.

A resonator 70(2) of a resonant frequency $f_2$ is coupled to the duplexing circuit 77 at a position deviated from the position of the resonant circuit 70(1) of the resonant frequency $f_1$ by 1/4 wavelength of the resonant frequency $f_2$ ($\lambda_{g2}/4$). This resonant circuit 70(2) is equivalent to the former-stage resonator 20(2) in FIG. 1. A resonant signal from the resonator 70(2) is output from an output terminal P72 via a coupling circuit 71(2).

Likewise, a resonator 70(3) of a resonant frequency $f_3$ is coupled to the duplexing circuit 77 at a position deviated from the position of the resonant circuit 70(1) of the resonant frequency $f_1$ by 3/4 wavelength of the resonant frequency $f_3$ ($3\lambda_{g3}/4$). This resonant circuit 70(3) is equivalent to the former-stage resonator 20(3) in FIG. 1. A resonant signal from the resonator 70(3) is output from an output terminal P73 via a coupling circuit 71(3).

Further, a resonator 70(4) of a resonant frequency $f_4$ is coupled to the duplexing circuit 77 at a position deviated from the position of the resonant circuit 70(1) of the resonant frequency $f_1$ by 5/4 wavelength of the resonant frequency $f_4$ ($5\lambda_{g4}/4$). This resonant circuit 70(4) is equivalent to the former-stage resonator 20(4) in FIG. 1. A resonant signal from the resonator 70(4) is output from an output terminal P74 via a coupling circuit 71(4).

Figure 19:
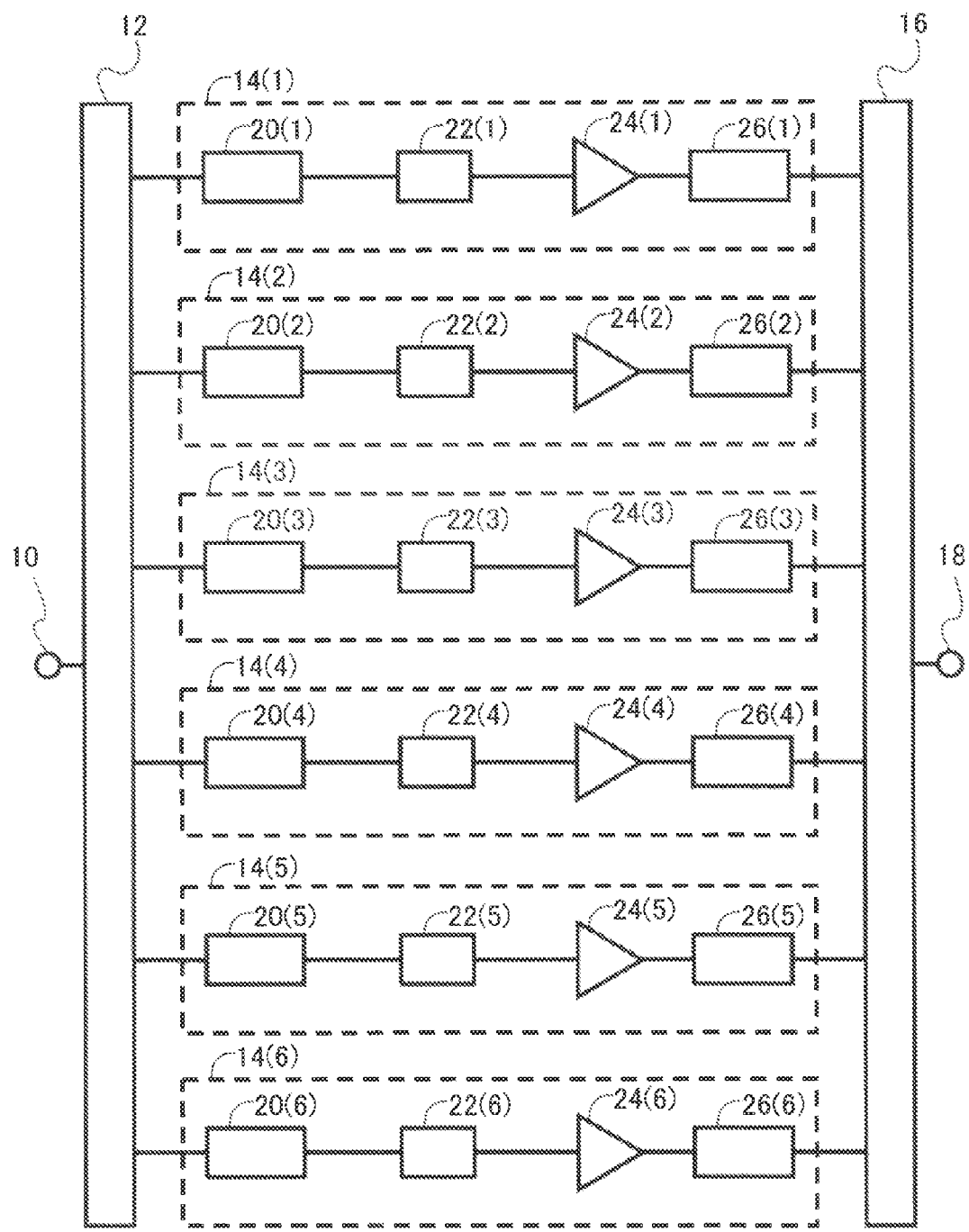
FIG. 19 is a schematic block diagram of an amplifier (i=6) according to the first embodiment.
Figure 20:
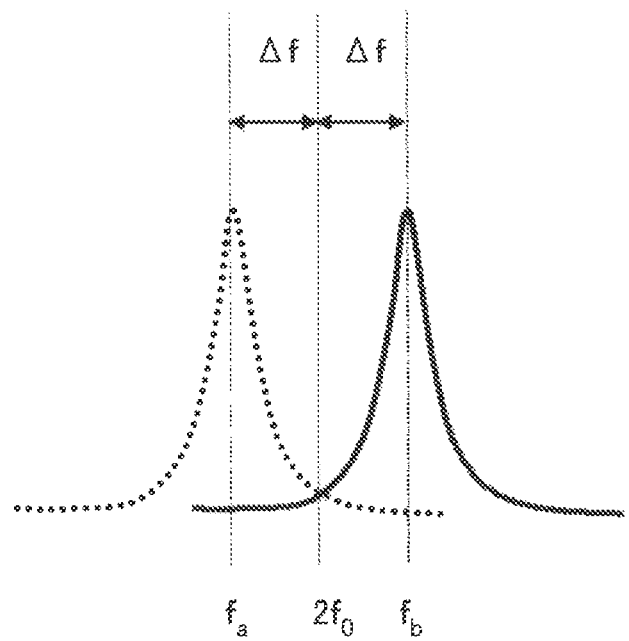
FIG. 20 shows the positional relationship between resonators at double frequencies in an amplifier (i=6) according to the first embodiment.
Figure 21:
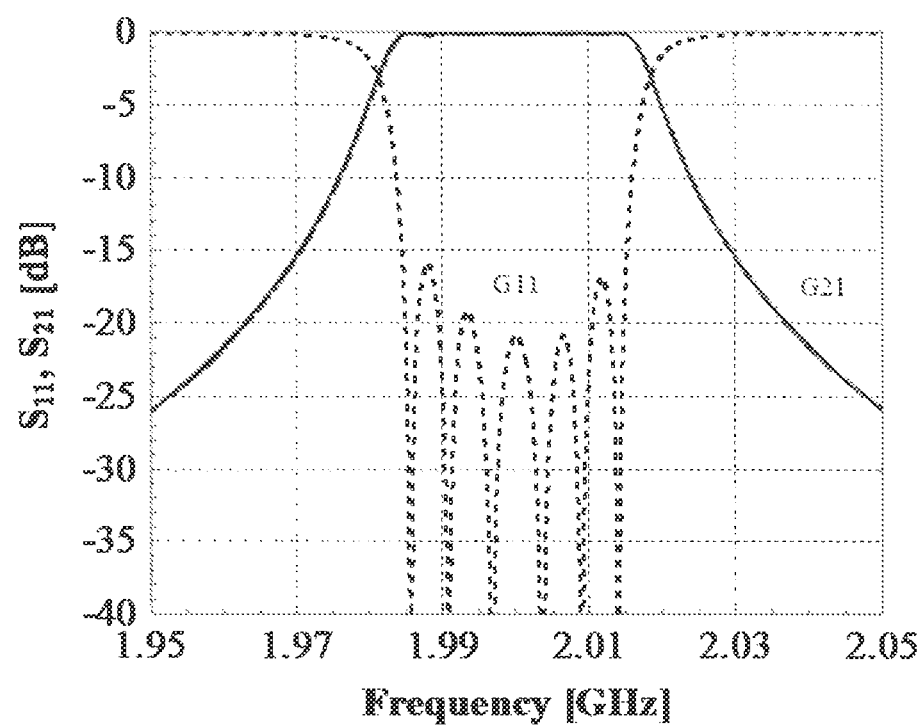
FIG. 21 shows the signal bandpass characteristics of an amplifier (i=6) according to the first embodiment.

Next, the signal bandpass characteristics of the amplifier of FIG. 1 are described. FIG. 19 is a schematic block diagram of the amplifier of FIG. 1 in which a simulation to examine the signal bandpass characteristics is performed. FIG. 20 shows the positional relationship between resonators at twice the frequency of the amplifier shown in FIG. 19. FIG. 21 shows the results of the simulation to examine the signal bandpass characteristics of the amplifier, and more specifically, the results of the simulation to examine the frequency response at each of the input terminal 10 and the output terminal 16.

As shown in FIG. 19, a simulation to examine the signal bandpass characteristics is performed in the amplifier of FIG. 1, where i is 6. In FIG. 20, the dotted line indicates the signal waveform of a 2nd harmonic as harmonic distortion that is output from blocks 14(1) through 14(3), and the solid line indicates the signal waveform of a 2nd harmonic as harmonic distortion that is output from blocks 14(4) through 14(6).

The 2nd harmonic signals that are output from the blocks 14(1) through 14(3) all have a harmonic frequency $f_a$, and the 2nd harmonic signals that are output from the blocks 14(4) through 14(6) all have a harmonic frequency $f_b$. Here, the relationships, $f_a<2f_1$, $f_b>2f_i$, and $(f_a+f_b)/2=2f_0$, are satisfied. The frequency $f_0$ is the center frequency of input modulation signals. Since the output signals represented by the dotted line and the solid line in FIG. 20 form coordinate-phase combining as described above, the signal intensity in the band between the frequencies $f_a$ and $f_b$ becomes lower, and, as a result, the harmonic distortion is also reduced.

When the signal bandpass characteristics shown in FIG. 21 are formed, input signals that are input to the input terminal 10 of FIG. 19 are flat signals, or signals having constant intensity in all the frequency bands. The fundamental resonant frequencies $f_1$ through $f_6$ of the former-stage resonators 20(1) through 20(6) and the latter-stage resonators 26(1) through 26(6) are 1.9812 GHz ($f_1$), 1.988 GHz ($f_2$), 1.9953 GHz ($f_3$), 2.0047 GHz ($f_4$), 2.012 GHz ($f_5$), and 2.0188 GHz ($f_6$), respectively.

The coupling Q value (or the external coupling Q value) for coupling the former-stage resonators 20(1) through 20(6) to external circuits is Qe=400. Here, the external circuits are the coupling circuits for coupling the former-stage resonators 20(1) through 20(6) to the power divider 12, and the coupling circuits for coupling the former-stage resonators 20(1) through 20(6) to the transmitting line units 22(1) through 22(6).

Likewise, the coupling Q value (or the external coupling Q value) for coupling the latter-stage resonators 26(1) through 26(6) to external circuits is Qe=400. Here, the external circuits are the coupling circuits for coupling the latter-stage resonators 26(1) through 26(6) to the power combiner 16, and the coupling circuits for coupling the latter-stage resonators 26(1) through 26(6) to the amplifying units 24(1) through 24(6).

The degree of coupling in this specification is defined as follows. Where the coupling Q value on the input side of each resonator is represented by $Q_{in}$, and the coupling Q value on the output side of each resonator is represented by $Q_{out}$, the degree of coupling of each resonator is expressed as: $1/(1/Q_{in}+1/Q_{out})$. For example, in FIG. 19, the degree of coupling of the former-stage resonator 20(1) is $1/(1/400+1/400)=200$.

FIG. 21 shows a graph (a reflection characteristics graph) G11 plotted on an coordinate system that has the abscissa axis indicating the frequency and the ordinate axis indicating a $S_{11}$ parameter (=reflected signal voltage/input signal voltage), and a graph (a bandpass characteristics graph) G21 plotted on an coordinate system that has the abscissa axis indicating the frequency and the ordinate axis indicating a $S_{21}$ parameter (=output signal voltage/input signal voltage). The graph G11 represents the frequency response at the input terminal 10, and the graph G21 represents the frequency response at the output terminal 18. As can be seen from the characteristics graphs G11 and G21, according to this embodiment, signals in a target band are allowed to pass, but most signals in non-target bands are not allowed to pass (are reflected toward the input terminal 10).

Although the gains of the amplifying units 24(1) through 24(6) are 0 db in the above example, the characteristics graph G21 can be shifted upward or downward by increasing the gains of the amplifying units 24(1) through 24(6). As described above, according to this embodiment, each signal in a target band is amplified and is then output with little distortion, and signals in non-target bands are not allowed to pass.

Figure 22:
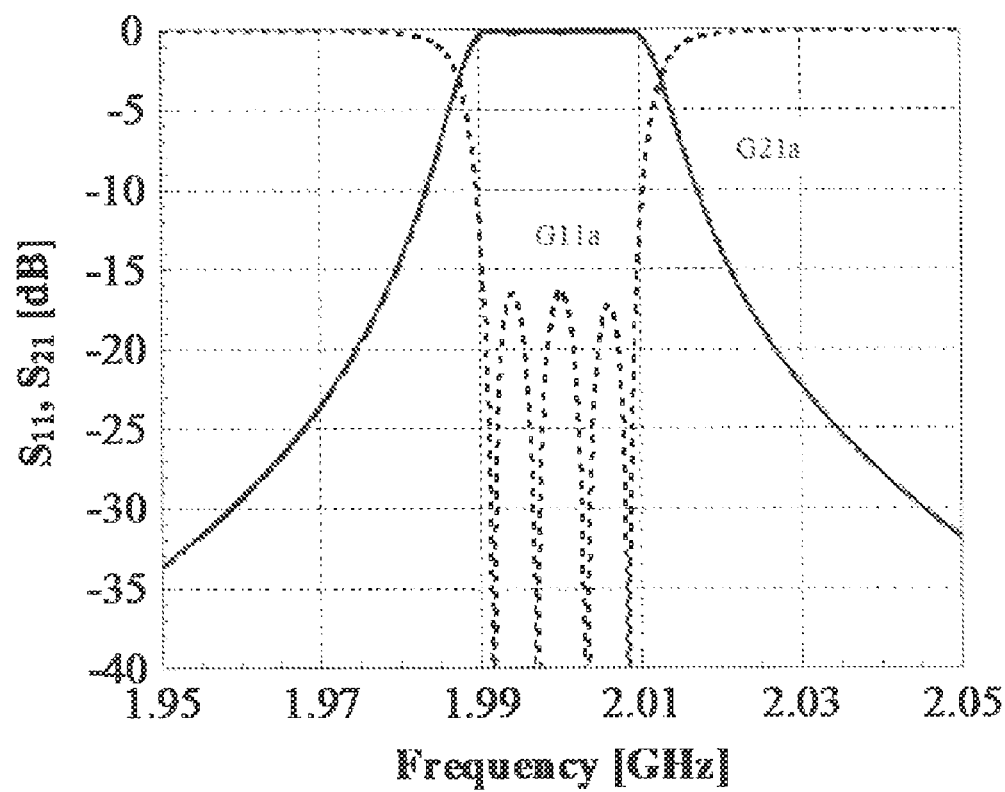
FIG. 22 shows the signal bandpass characteristics of an amplifier (i=4) according to the first embodiment.

FIG. 22 shows the results of a simulation performed to examine the signal bandpass characteristics of an amplifier having a different structure from the amplifier in the case illustrated in FIG. 21. In this example, four former-stage resonators 20(1) through 20(4) and four latter-stage resonators 26(1) through 26(4) are arranged in an amplifier (i=4) having the structure shown in FIG. 1. FIG. 22 shows the frequency responses (the frequency responses at the input terminal 10 and the output terminal 18) observed in a case where the coupling Q value Qe differs among the blocks 14(1) through 14(4) (or the degree of resonator coupling varies among the blocks).

Here, the gains of the amplifying units 24(1) through 24(4) are 0 dB, the resonant frequency $f_1$ of the former-stage resonator 20(1) and the latter-stage resonator 26(1) is 1.988 GHz, the resonant frequency $f_2$ of the former-stage resonator 20(2) and the latter-stage resonator 26(2) is 1.9958 GHz, the resonant frequency $f_3$ of the former-stage resonator 20(3) and the latter-stage resonator 26(3) is 2.0042 GHz, and the resonant frequency $f_4$ of the former-stage resonator 20(4) and the latter-stage resonator 26(4) is 2.012 GHz, as in the case shown in FIG. 21.

The coupling Q values Qe1 and Qe4 of the former-stage resonator 20(1), the latter-stage resonator 26(1), the former-stage resonator 20(4), and the latter-stage resonator 26(4) are 500, and the coupling Q values Qe2 and Qe3 of the former-stage resonator 20(2), the latter-stage resonator 26(2), the former-stage resonator 20(3), and the latter-stage resonator 26(3) are 400. Accordingly, the coupling Q value of the former-stage and latter-stage resonators at either end of the target band is higher (the degree of coupling is higher). In this manner, the coupling Q value of the resonators at either end of the target band is made higher, so that the attenuation outside the target band can be made larger, as can be seen from the graph G11a of the $S_{11}$ parameter and the graph G21a of the $S_{21}$ parameter.

Embodiment 2

An amplifier according to a second embodiment of the present invention is the same as the amplifier according to the first embodiment, except that each nth block (n being an integer between 1 and i) has an amplitude adjusting unit that adjusts the amplitude of each signal passing through the nth block. Therefore, explanation of the same components as those of the first embodiment will not be repeated here.

Figure 23:
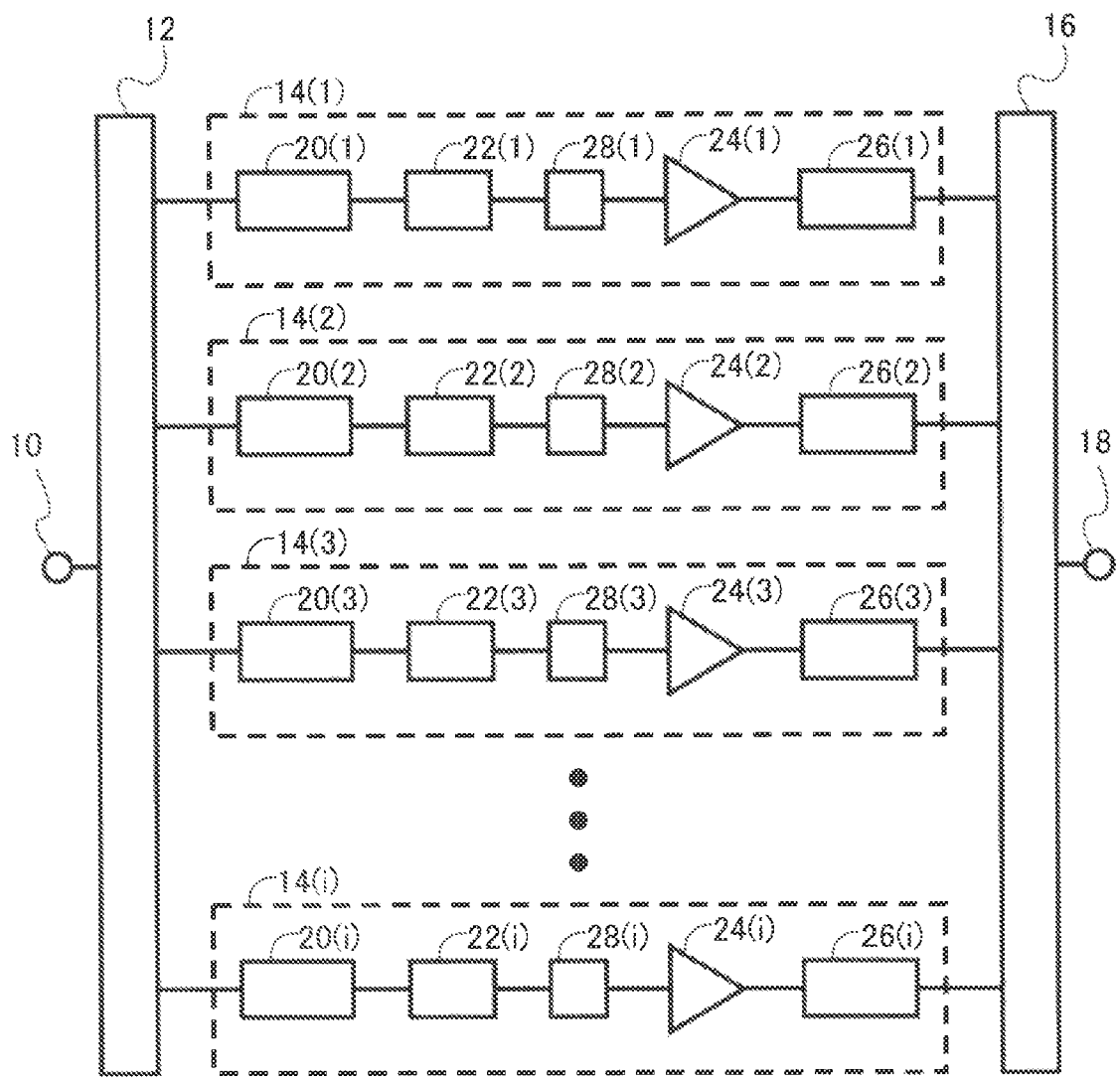
FIG. 23 is a schematic block diagram of an amplifier according to a second embodiment of the present invention.

FIG. 23 is a schematic block diagram of the amplifier of this embodiment. As shown in FIG. 23, each block 20(n) (n being an integer between 1 and i) has an amplitude adjusting unit 28(n) interposed between the transmitting line unit 22(n) as the phase adjusting unit and the amplifying unit 24(n). The amplitude adjusting unit 28(n) adjusts the amplitude of each signal passing through the nth block.

In the amplifier shown in FIG. 1, the amplitudes of the signals to be combined need to be the same at the power combining point, so as to obtain an output signal with little distortion. However, the gains of amplifying units vary during the manufacturing process, and it might be difficult to make the amplitudes of signals uniform at the power combining point.

In the amplifier shown in FIG. 23, the amplitude adjusting units 28(1) through 28(i) are provided in the respective blocks 14(1) through 14(i), so that the amplitude of each signal can be adjusted at each block. Thus, the amplitudes of signals to be combined can be readily made uniform at the power combining point, and an amplified output signal with little distortion can be obtained.

Although each amplitude adjusting unit 28(n) is provided between the corresponding transmitting line unit 22(n) and the corresponding amplifying unit 24(n) in FIG. 23, each amplitude adjusting unit 28(n) may be provided in a stage before the transmitting line unit 22(n).

Embodiment 3

An amplifier according to a third embodiment of the present invention is the same as the amplifier according to the first embodiment, except that each nth block (n being an integer between 1 and i) has a phase varying unit that makes the phase of each signal passing through the nth block variable. Therefore, explanation of the same components as those of the first embodiment will not be repeated here.

Figure 24:
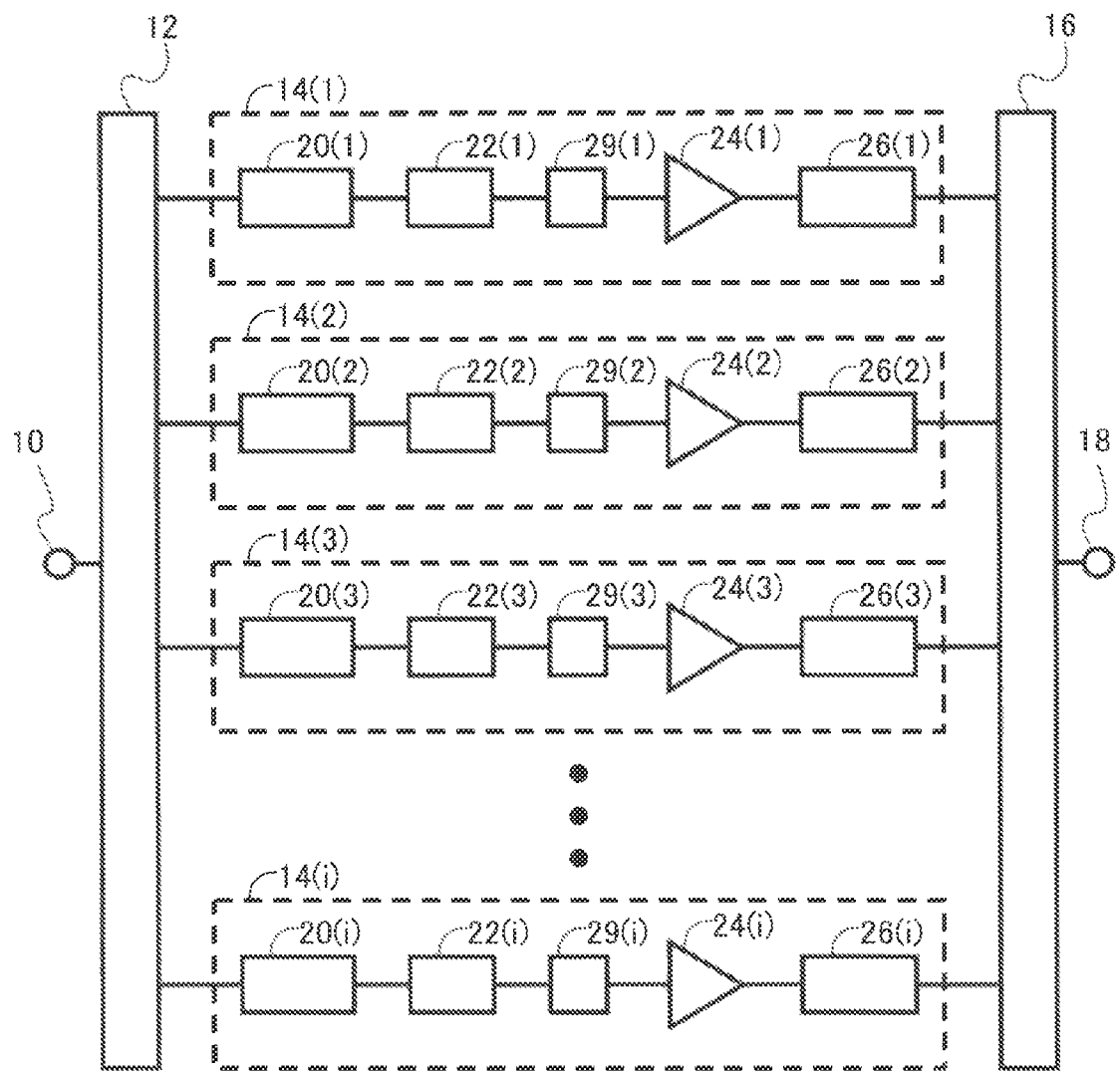
FIG. 24 is a schematic block diagram of an amplifier according to a third embodiment of the present invention.

FIG. 24 is a schematic block diagram of the amplifier of this embodiment. As shown in FIG. 24, each block 20(n) (n being an integer between 1 and i) has a phase varying unit 29(n) interposed between the transmitting line unit 22(n) as the phase adjusting unit and the amplifying unit 24(n). The phase varying unit 29(n) can change the phase of each signal passing through the nth block, with respect to the other blocks.

In the amplifier shown in FIG. 1, it is preferable that the phase difference between signals to be combined is in the range of $(180\pm15)+360\times n$ degrees (n being an integer of 0 or greater) in the fundamental waves of the signals of adjacent blocks, and is in the range of $(360\pm30)+720\times n$ degrees (n being an integer of 0 or greater) in 2nd harmonics (harmonic waves) to obtain the output signal with little distortion. However, the bandpass phases vary due to variations in the characteristics of amplifying units caused during the manufacturing process, and it might be difficult to make the phase differences of signals uniform at the power combining point.

In the amplifier shown in FIG. 24, the phase varying units 29(1) through 29(i) are provided in the respective blocks 14(1) through 14(i), so that the phase of each signal can be changed at each block. Thus, the phases of signals to be combined can be readily made uniform at the power combining point, and an amplified output signal with little distortion can be obtained.

Although each phase varying unit 29(n) is provided between the corresponding transmitting line unit 22(n) and the corresponding amplifying unit 24(n) in FIG. 24, each phase varying unit 29(n) may be provided in a stage before the transmitting line unit 22(n).

Embodiment 4

An amplifier according to a fourth embodiment of the present invention is the same as the amplifier according to the first embodiment, except that each nth amplifying unit has a switching unit that switches the nth amplifying unit between an operating state and a non-operating state in response to an external control signal. Therefore, explanation of the same components as those of the first embodiment will not be repeated here.

Figure 25:
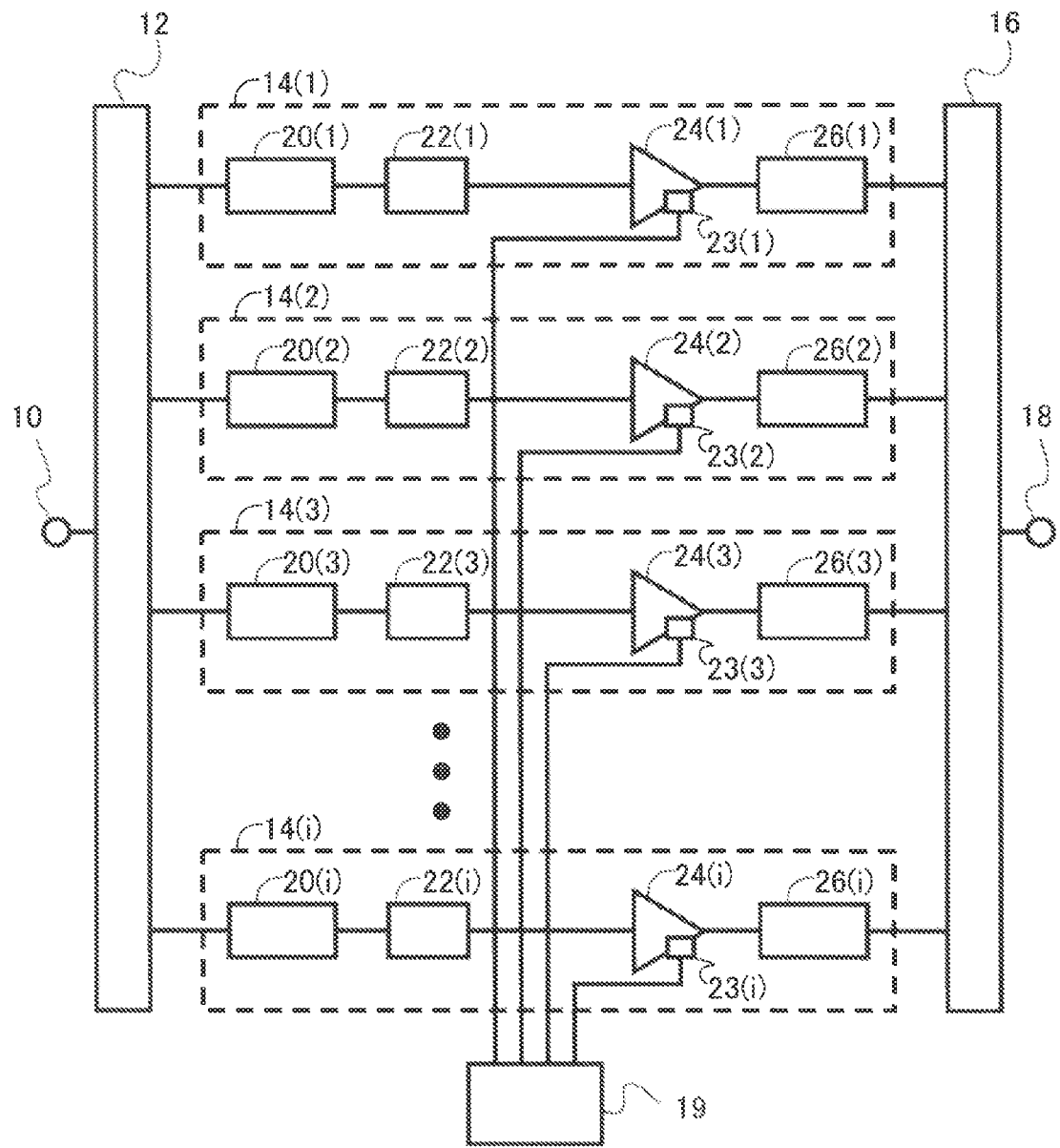
FIG. 25 is a schematic block diagram of an amplifier according to a fourth embodiment of the present invention.

FIG. 25 is a schematic block diagram of the amplifier of this embodiment. As shown in FIG. 25, each amplifying unit 24(n) ($1 \leq n \leq i$) has a switching unit 23(n) that switches its state between an operating state and a non-operating state (ON state and OFF state). An external control device 19 transmits the external control signal, and, in response to the external control signal, each of the amplifying units 24(1) through 24(i) switches its operating state with the use of the corresponding switching unit 23(n).

Figure 26:
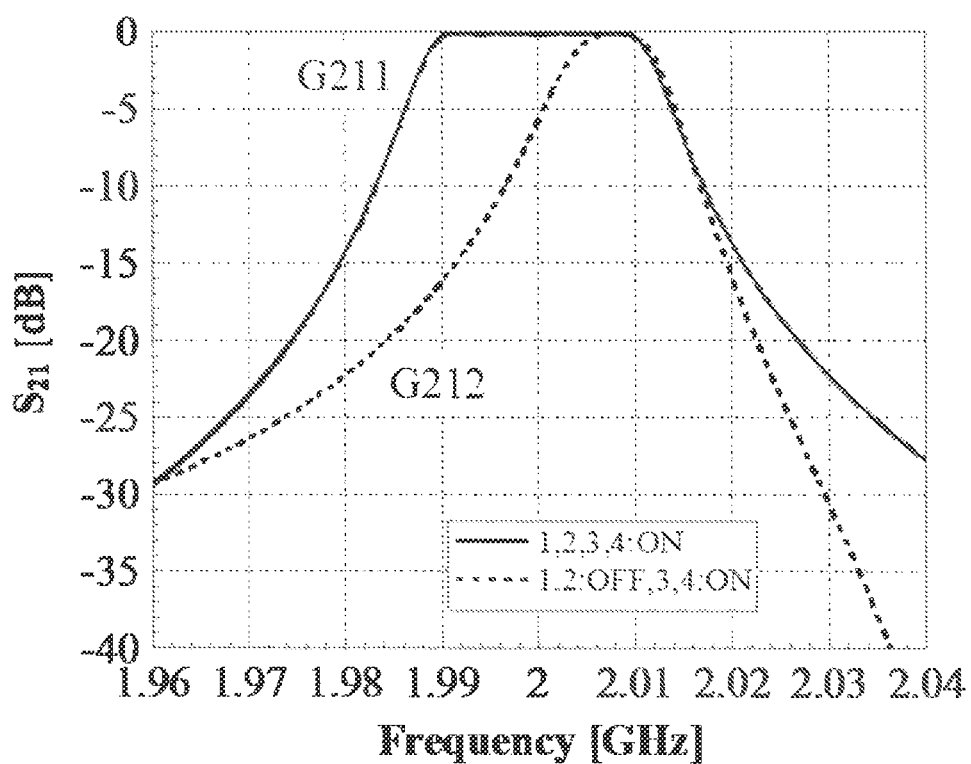
FIG. 26 shows the signal bandpass characteristics of an amplifier (i=4) according to the fourth embodiment.

FIG. 26 shows the signal bandpass characteristics of the amplifier shown in FIG. 25. A simulation is performed in a case where i is 4, while the number of amplifying units to be operated is varied by the switching units. In FIG. 26, the abscissa axis indicates the frequency, and the ordinate axis indicates the $S_{21}$ parameter.

In FIG. 26, the graph G211 shows the results of a simulation performed where all the four amplifying units 24(1) through 24(4) are operated. The graph G212 shows the results of a simulation performed where only two amplifying units 24(3) and 24(4) are operated. As can be seen from the graphs G211 and G212, a desired output signal can be obtained by operating only necessary amplifying units according to the band of signals to be transmitted. Accordingly, the power consumption can be reduced. Thus, according to this embodiment, highly efficient operations can be maintained for signals of different bandwidths.

Embodiment 5

A radio transmitting device according to a fifth embodiment of the present invention includes an amplifier according to the foregoing embodiments. Therefore, explanation of the amplifier will not be repeated in the following description.

Figure 27:
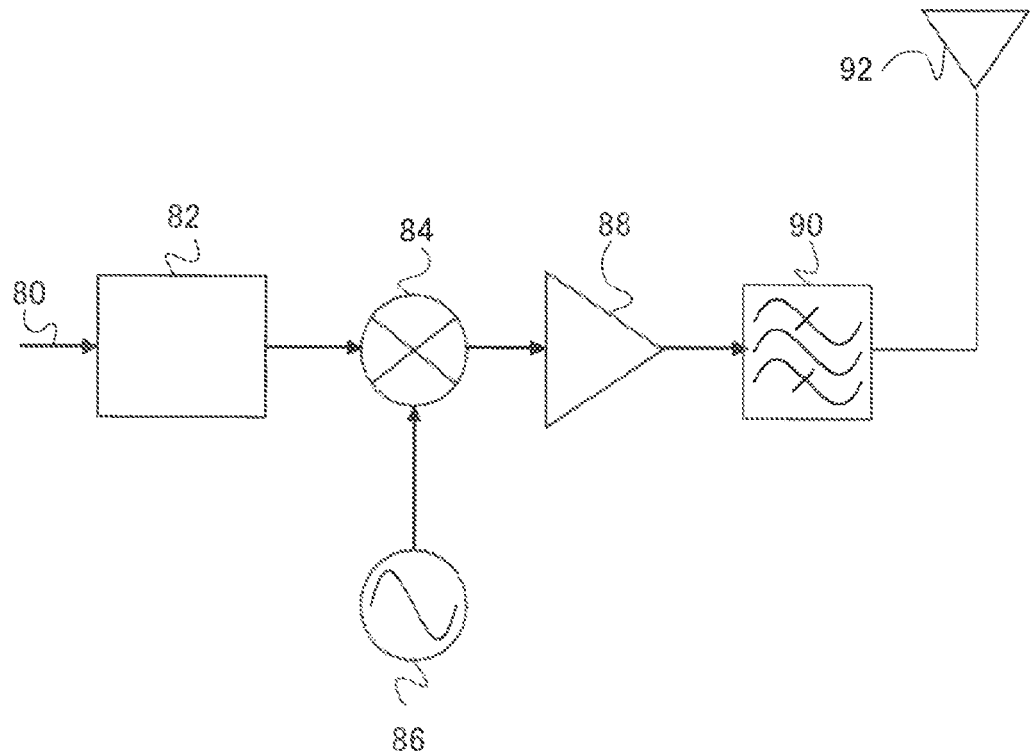
FIG. 27 is a schematic block diagram of a radio transmitting device according to a fifth embodiment of the present invention.

FIG. 27 is a schematic view of the radio transmitting device according to this embodiment. This radio transmitting device includes: a signal processing circuit 82 that has transmitting data 80 input thereto as a signal; a local signal generator 86 that generates a local signal; a frequency converter 84 that multiplies the transmitting signal processed at the signal processing circuit 82 by the local signal, so as to convert the frequency; a power amplifier 88 that amplifies the transmitting signal having the frequency converted by the frequency converter 84; a band-limiting filter (a transmitting filter) 90 that puts a band limit on the transmitting signal amplified by the power amplifier 88; and an antenna 92 that transmits the transmitting signal having the band limited.

The transmitting data 80 is input to the signal processing circuit 82, and transmitting processing, such as a digital-to-analog conversion, encoding, and modulating, is performed on the transmitting data 80. In this manner, a transmitting signal of a baseband or an intermediate frequency (IF) band is generated.

The transmitting signal generated by the signal processing circuit 82 is input to the frequency converter (a mixer) 84, and is multiplied by the local signal generated from the local signal generator 86. In this manner, the transmitting signal is frequency-converted to a signal of a radio frequency (RF) band. In other words, the transmitting signal is up-converted. The RF signal output from the mixer 84 is then amplified by the power amplifier (PA) 88 that is an amplifier according to the foregoing embodiments, and the amplifier signal is input to the band-limiting filter (the transmitting filter) 90.

At the transmitting filter 90, a band limit is put on the RF signal amplified by the power amplifier 88, and unnecessary frequency components are removed. The RF signal is then transmitted as a radio wave from the antenna 92 toward the outside. If the unnecessary frequency components can be sufficiently removed at the power amplifier 88, it may be not necessary to employ the band-limiting filter 90.

In the radio transmitting device shown in FIG. 27, RF signals with little distortion can be transmitted, by virtue of the amplifier that can efficiently amplify signals with little distortion.

Embodiment 6

A radio receiving device according to a sixth embodiment of the present invention includes an amplifier according to the foregoing embodiments. Therefore, explanation of the amplifier will not be repeated in the following description.

Figure 28:
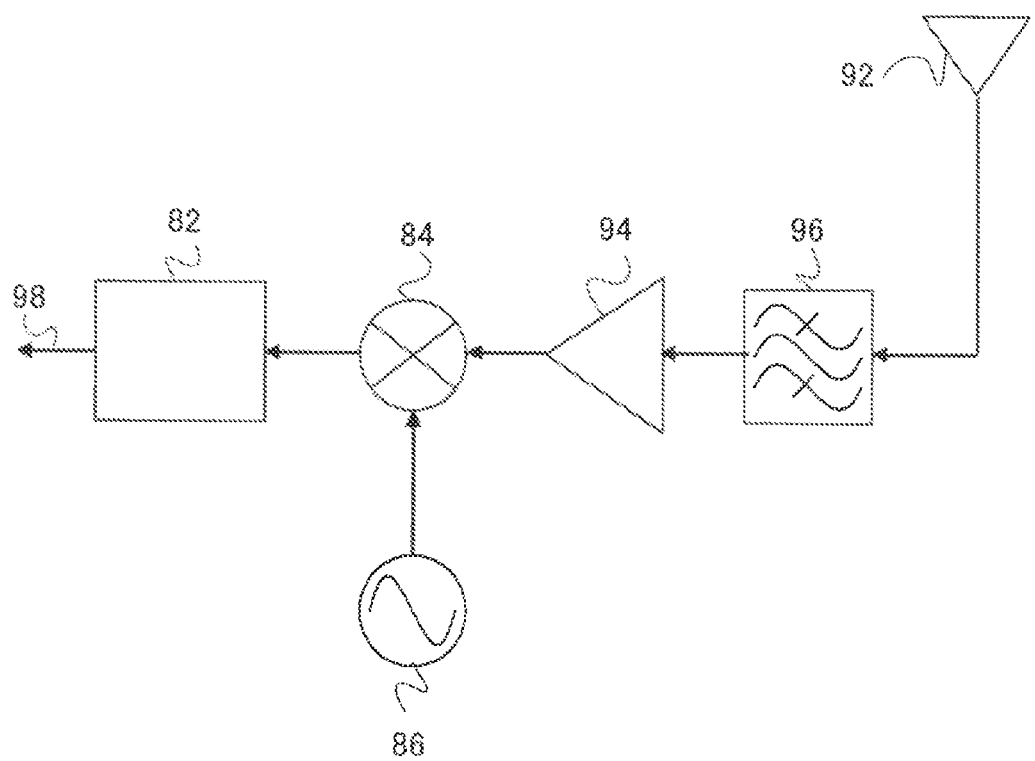
FIG. 28 is a schematic block diagram of a radio receiving device according to a sixth embodiment of the present invention.

FIG. 28 is a schematic view of the radio receiving device according to this embodiment. This radio receiving device includes: an antenna 92 to which a signal is input; a band-limiting filter (a receiving filter) 96 that puts a band limit on the signal received through the antenna 92; a low noise amplifier 94 that amplifies the band-limited signal; a local signal generator 86 that generates a local signal; a frequency converter 84 that multiplies the signal amplified by the low noise amplifier 94 by the local signal, so as to convert the frequency; and a signal processing circuit 82 that performs processing on the signal frequency-converted by the frequency converter 84.

A signal received by the antenna 92 is input to the band-limiting filter (the receiving filter) 96. At the receiving filter 96, a band limit is put on the signal, and unnecessary frequency components are removed. The signal is then input to the low noise amplifier (LNA) 94 that is an amplifier according to the foregoing embodiments.

The signal amplified by the low noise amplifier 94 is then input to the frequency converter (a mixer) 84, and is multiplied by the local signal generated from the local signal generator 86. In this manner, the signal is converted to a signal of a baseband or an intermediate frequency. After the conversion, the signal of a low frequency is input to the signal processing circuit 82, and demodulating is performed on the signal. As a result, receiving data 98 is output. If the unnecessary frequency components can be sufficiently removed at the low noise amplifier (LNA) 96, it is not necessary to provide the band-limiting filter 96.

In the radio receiving device shown in FIG. 28, signals that are input through the antenna can be amplified and received as signals with little distortion, by virtue of the amplifier that can efficiently amplify signals with little distortion.

The embodiments of the present invention have been described so far by way of specific examples. Although the components that are not necessary in the description of the present invention have not been described for the amplifiers, the radio transmitting device, the radio receiving device, and the like, it is possible to arbitrarily select and use components for an amplifier, a radio transmitting device, a radio receiving device, and the like.

Any amplifiers, radio transmitting devices, and radio receiving devices that include the components of the present invention and can be designed and modified by those skilled in the art are within the scope of the present invention. The scope of the present invention is defined by the claims and their equivalents.

What is claimed is:

1. An amplifier comprising:
    an input terminal configured to have an input signal of a center frequency $f_0$ input thereto;
    a dividing unit that is connected to the input terminal and divides the input signal;
    first through ith (i being an even number of 2 or greater) blocks that are connected in parallel to the dividing unit, respectively, and have the divided input signal transmitted thereto;
    a combining unit that is connected to the first through ith blocks and combines signals transmitted through the first through ith blocks; and
    an output terminal that is connected to the combining unit and outputs the signals combined by the combining unit,
    the nth block (n being an integer between 1 and i) including a nth former-stage resonator having a fundamental resonant frequency $f_n$, a nth amplifying unit configured to amplify a signal transmitted through the nth former-stage resonator, a nth latter-stage resonator having the fundamental resonant frequency $f_n$, and a nth phase adjusting unit, the signal transmitted through the nth amplifying unit being transmitted through the nth latter-stage resonator,
    the fundamental resonant frequency $f_m$ (m being an integer between 1 and i-1) satisfying the relationship, $f_m \leq f_{(m+1)}$,
    the nth latter-stage resonator being one of a jth latter-stage resonator (j being i/2 integers selected from 1 to i) having a harmonic resonant frequency $f_{aj}$ lower than $2f_1$, and a kth latter-stage resonator (k being i/2 integers selected from 1 to i, except for j) having a harmonic resonant frequency $f_{bk}$ higher than $2f_i$, a kth latter-stage resonator having a harmonic resonant frequency $f_{bk}$ exists that satisfies the relationship of $(f_{aj}+f_{bk})/2=2f_0$ for each jth latter-stage resonator, the mth phase adjusting unit (m being an integer between 1 and i−1) being configured to reverse a phase of a phase difference between a signal of the fundamental resonant frequency $f_m$ passing through the mth block and a signal of the fundamental resonant frequency $f_{(m+1)}$ passing through the (m+1)th block, the nth phase adjusting unit (n being an integer between 1 and i) being configured to maintain all phase differences among signals of $2f_n$ passing through the nth block in the coordinate-phase.

2. The amplifier according to claim 1, wherein the harmonic resonant frequency $f_{aj}$ is a constant frequency, and the harmonic resonant frequency $f_{bk}$ is a constant frequency.

3. The amplifier according to claim 1, wherein the phase adjusting unit is formed with a transmitting line.

4. The amplifier according to claim 1, wherein the nth block has an amplitude adjusting unit configured to adjust amplitude of a signal passing through the nth block.

5. The amplifier according to claim 1, wherein the nth block has a phase varying unit configured to change a phase of a signal passing through the nth block.

6. The amplifier according to claim 1, wherein the nth amplifying unit has a switching unit configured to switch the nth amplifying unit between an operating state and a non-operating state, in response to an external control signal.

7. The amplifier according to claim 1, wherein the nth latter-stage resonator is formed with a microstrip line having different line widths at a center portion thereof and end portions thereof.

8. A radio transmitting device comprising:
a signal processing circuit configured to have a signal input thereto;
a local signal generator configured to generate a local signal;
a frequency converter configured to perform a frequency conversion by multiplying the signal processed at the signal processing circuit by the local signal;
an amplifier configured to amplify the signal frequency-converted by the frequency converter; and
an antenna configured to transmit the signal amplified by the amplifier,
the amplifier including:
an input terminal configured to have an input signal of a center frequency $f_0$ input thereto;
a dividing unit that is connected to the input terminal and divides the input signal;
first through ith (i being an even number of 2 or greater) blocks that are connected in parallel to the dividing unit, respectively, and have the divided input signal transmitted thereto;
a combining unit that is connected to the first through ith blocks and combines signals transmitted through the first through ith blocks; and
an output terminal that is connected to the combining unit and outputs the signals combined by the combining unit,
the nth block (n being an integer between 1 and i) including a nth former-stage resonator having a fundamental resonant frequency $f_n$, a nth amplifying unit configured to amplify a signal transmitted through the nth former-stage resonator, a nth latter-stage resonator having the fundamental resonant frequency $f_n$, and a nth phase adjusting unit, the signal transmitted through the nth amplifying unit being transmitted through the nth latter-stage resonator, the fundamental resonant frequency $f_m$ (m being an integer between 1 and i−1) satisfying the relationship, $f_m \leq f_{(m+1)}$, the nth latter-stage resonators being one of a jth latter-stage resonator (j being i/2 integers selected from 1 to i) having a harmonic resonant frequency $f_{aj}$ lower than $2f_1$, and a kth latter-stage resonator (k being i/2 integers selected from 1 to i, except for j) having a harmonic resonant frequency $f_{bk}$ higher than $2f_i$, a kth latter-stage resonators having a harmonic resonant frequency $f_{bk}$ exists that satisfies the relationship of $(f_{aj}+f_{bk})/2=2f_0$ for each jth latter-stage resonator, the mth phase adjusting unit (m being an integer between 1 and i−1) being configured to reverse a phase of a phase difference between a signal of the fundamental resonant frequency $f_m$ passing through the mth block and a signal of the fundamental resonant frequency $f_{(m+1)}$ passing through the (m+1)th block, the nth phase adjusting unit (n being an integer between 1 and i) being configured to maintain all phase differences among signals of $2f_n$ passing through the nth block in the coordinate-phase.

9. The radio transmitting device according to claim 8, wherein the harmonic resonant frequency $f_{aj}$ is a constant frequency, and the harmonic resonant frequency $f_{bk}$ is a constant frequency.

10. The radio transmitting device according to claim 8, wherein the phase adjusting unit is formed with a transmitting line.

11. The radio transmitting device according to claim 8, wherein the nth block has an amplitude adjusting unit configured to adjust amplitude of a signal passing through the nth block.

12. The radio transmitting device according to claim 8, wherein the nth block has a phase varying unit configured to change a phase of a signal passing through the nth block.

13. The radio transmitting device according to claim 8, wherein the nth amplifying unit has a switching unit configured to switch the nth amplifying unit between an operating state and a non-operating state, in response to an external control signal.

14. The radio transmitting device according to claim 8, wherein the nth latter-stage resonator is formed with a microstrip line having different line widths at a center portion thereof and end portions thereof.

15. A radio receiving device comprising:
an antenna configured to have a signal input thereto;
an amplifier configured to amplify the signal received through the antenna;
a local signal generator configured to generate a local signal;
a frequency converter configured to perform a frequency conversion by multiplying the signal amplified at the amplifier by the local signal; and
a signal processing circuit configured to perform processing on the signal frequency-converted by the frequency converter,
the amplifier including:
an input terminal configured to have an input signal of a center frequency $f_0$ input thereto;
a dividing unit that is connected to the input terminal and divides the input signal;

first through ith (i being an even number of 2 or greater) blocks that are connected in parallel to the dividing unit, respectively, and have the divided input signal transmitted thereto;

a combining unit that is connected to the first through ith blocks and combines signals transmitted through the first through ith blocks; and an output terminal that is connected to the combining unit and outputs the signals combined by the combining unit, the nth block (n being an integer between 1 and i) including a nth former-stage resonator having a fundamental resonant frequency $f_n$, a nth amplifying unit configured to amplify a signal transmitted through the nth former-stage resonator, a nth latter-stage resonator having the fundamental resonant frequency $f_n$, and a nth phase adjusting unit, the signal transmitted through the nth amplifying unit being transmitted through the nth latter-stage resonator, the fundamental resonant frequency $f_m$ (m being an integer between 1 and i−1) satisfying the relationship, $f_m \leq f_{(m+1)}$, the nth latter-stage resonator being one of a jth latter-stage resonator (j being i/2 integers selected from 1 to i) having a harmonic resonant frequency $f_{aj}$ lower than $2f_1$, and a kth latter-stage resonator (k being i/2 integers selected from 1 to i, except for j) having a harmonic resonant frequency $f_{bk}$ higher than $2f_i$, a kth latter-stage resonator having a harmonic resonant frequency $f_{bk}$ exists that satisfies the relationship of $(f_{aj}+f_{bk})/2=2f_0$ for each jth latter-stage resonator, the mth phase adjusting unit (m being an integer between 1 and i−1) being configured to reverse a phase of a phase difference between a signal of the fundamental resonant frequency $f_m$ passing through the mth block and a signal of the fundamental resonant frequency $f_{(m+1)}$ passing through the (m+1)th block, the nth phase adjusting unit (n being an integer between 1 and i) being configured to maintain all phase differences among signals of $2f_n$ passing through the nth block in the coordinate-phase.

16. The radio receiving device according to claim 15, wherein the phase adjusting unit is formed with a transmitting line.

17. The radio receiving device according to claim 15, wherein the nth block has an amplitude adjusting unit configured to adjust amplitude of a signal passing through the nth block.

18. The radio receiving device according to claim 15, wherein the nth block has a phase varying unit configured to change a phase of a signal passing through the nth block.

19. The radio receiving device according to claim 15, wherein the nth amplifying unit has a switching unit configured to switch the nth amplifying unit between an operating state and a non-operating state, in response to an external control signal.

20. The radio receiving device according to claim 15, wherein the nth latter-stage resonator is formed with a microstrip line having different line widths at a center portion thereof and end portions thereof.

* * * * *